(12) United States Patent
Dao et al.

(10) Patent No.: US 9,371,067 B2
(45) Date of Patent: Jun. 21, 2016

(54) INTEGRATED BATTERY CONTROL SYSTEM

(71) Applicant: Elite Power Solutions LLC, Tempe, AZ (US)

(72) Inventors: Yuan Dao, Phoenix, AZ (US); William Jeffrey Schlanger, Flagstaff, AZ (US)

(73) Assignee: Elite Power Solutions LLC, Tempe, AZ (US)

( * ) Notice: Subject to any disclaimer, the term of this patent is extended or adjusted under 35 U.S.C. 154(b) by 0 days.

(21) Appl. No.: 14/663,896

(22) Filed: Mar. 20, 2015

(65) Prior Publication Data

US 2015/0191162 A1    Jul. 9, 2015

Related U.S. Application Data

(63) Continuation-in-part of application No. 13/077,136, filed on Mar. 31, 2011, now Pat. No. 9,000,935.

(51) Int. Cl.
| | |
|---|---|
| *B60L 9/00* | (2006.01) |
| *B60W 10/26* | (2006.01) |
| *B60L 11/18* | (2006.01) |
| *H04Q 9/00* | (2006.01) |
| *G01R 31/36* | (2006.01) |
| *H01M 10/48* | (2006.01) |
| *H01M 10/42* | (2006.01) |

(52) U.S. Cl.
CPC ............ *B60W 10/26* (2013.01); *B60L 11/1861* (2013.01); *H04Q 9/00* (2013.01); *B60W 2510/244* (2013.01); *B60W 2710/248* (2013.01); *G01R 31/3658* (2013.01); *H01M 10/486* (2013.01); *H01M 2010/4271* (2013.01); *H04Q 2209/10* (2013.01); *H04Q 2209/30* (2013.01); *H04Q 2209/823* (2013.01)

(58) Field of Classification Search
None
See application file for complete search history.

(56) References Cited

U.S. PATENT DOCUMENTS

| | | | | |
|---|---|---|---|---|
| 2013/0339757 | A1* | 12/2013 | Reddy | G06F 1/3212 713/300 |
| 2014/0068310 | A1* | 3/2014 | Sultenfuss | G06F 1/28 713/340 |
| 2015/0143150 | A1* | 5/2015 | Verdun | G06F 1/263 713/323 |
| 2015/0153810 | A1* | 6/2015 | Sasidharan | G06F 1/3212 713/320 |

\* cited by examiner

*Primary Examiner* — Adam Alharbi
(74) *Attorney, Agent, or Firm* — Invention to Patent Services; Alex Hobson

(57) ABSTRACT

An integrated battery control system incorporates a battery management system and a power control system to reliably and safely provide power to vehicles and other mobile devices. The integrated power control system incorporates safety features to protect the batteries from dropping below a threshold voltage or being overcharged, and from operating the vehicle when it is coupled with an AC power supply. An integrated power control system may be contained in a control enclosure having a computing device, battery power input, an AC power input, a power output switch, a power output, a key-switch interface and a shunt to measure current flow. The power control system regulates electrical power delivery to a drive motor and a pre-charge resistor as a function of the battery state of charge. When a battery unit is below a threshold value, power delivery is disabled to the drive motor and a pre-charge resistor.

20 Claims, 29 Drawing Sheets

Output Turns on With Alarm

Output Turns off With Alarm

INTEGRATED BATTERY CONTROL SYSTEM

CROSS REFERENCE TO RELATED APPLICATIONS

This application is a continuation in part of U.S. patent application no. U.S. patent application Ser. No. 13/077,136, filed on Mar. 31, 2011, entitled Battery Management System and currently pending; the entirety of which is incorporated by reference herein.

FIELD OF THE INVENTION

The present invention relates to an integrated battery control system and particularly to an integrated battery control system for vehicles and other mobile devices. An exemplary integrated battery control system incorporates a battery management system and a power control system within a single control enclosure.

BACKGROUND

Electric vehicles including golf carts, automobiles, and the like, employ batteries, such as lithium batteries, that can become damaged if discharged to too low of a voltage or overcharged to too high of a voltage. Charging batteries typically involves a separate battery charger. This charger may be connected to the batteries via a power inlet and a plug attached to a cable which, in turn, is connected to the charger. A wall electrical outlet may provide a source for battery charging. Many people may forget that their vehicle is plugged in and proceed to start the vehicle and drive off; therein damaging the vehicle charging components and/or the outlet. In addition, anyone near the vehicle as the charger cord is ripped from the wall or the vehicle could be injured.

Lithium ion batteries require special controls in many applications as they require monitoring of their state of charge to ensure that they are not operated below a threshold voltage value and/or are not over charged. Lithium batteries can be irreversibly damaged if operated below a threshold voltage value. Lithium batteries may lose their ability to be fully charged if they are operated below a threshold voltage for too long. A plurality of lithium batteries would be required to generate the voltage needed for most vehicles and therefore a plurality of lithium batteries may need to be connected in series. When a plurality of batteries are coupled together, it is important to keep the level of charge of each battery within a range of the other batteries to prevent damage and to get maximum capacity.

As shown in FIG. 1, lithium batteries have a non-linear discharge profile, with a relatively flat discharge region up to about 80% discharged. Therefore, a small change in voltage can mean a large difference in the state of charge, unlike a lead acid battery that has a relatively linear drop in voltage as the battery is discharged. The state of charge of a lead acid battery, and therefore the amount of power remaining, is more easily monitored by a battery monitoring system by simply measuring the voltage of the lead acid battery. The amount of power remaining in a lithium battery system is more difficult to monitor and predict however by simply measuring voltage. It would therefore be more difficult to determine the available power remaining in a lithium battery unit by simply measuring the voltage.

Current charging systems are configured to charge a battery pack to a predetermined voltage. However, the individual batteries within a battery pack may not be charged to the same level, and the discrepancy between the batteries state of charge levels can cause capacity to be limited. The battery pack capacity is limited to the capacity of the lowest battery unit. Additionally, when a battery has a lower state-of-charge level, as the battery discharges, it may discharge to a level resulting in permanent loss of charging capacity.

Current battery management systems obtain data about individual batteries in a battery unit. The systems reserve addresses for communication with battery unit sensors and/or battery units. When sensors transmit data about battery units to the management system, the sensors include the address of the battery unit. Such a system may require significant amounts or resources and complex arrangements for connecting the components of the system.

SUMMARY OF THE INVENTION

The invention is directed to an integrated battery control system that is particularly useful for vehicles and other mobile devices, and incorporates a battery management system and a power control system. The integrated battery control system incorporates safety features to protect the batteries and ensure proper charging and operation of a battery powered device, such as a vehicle, with respect to the batteries. In an exemplary embodiment, the integrated battery control system incorporates a battery management system as described in U.S. patent application Ser. No. 13/077,136, entitled Battery Management System and incorporated herein by reference. In other exemplary embodiments, the integrated battery control system incorporates components of an uninterrupted battery power supply system as described in U.S. patent application Ser. No. 14/225,251, entitled Uninterrupted Lithium Battery Power Supply System and incorporated, in its entirety, by reference herein. In an exemplary embodiment, the integrated battery control system comprises a control enclosure having a computing device that receives input from the battery unit monitoring module or modules, a control system computing device, a battery power input, an AC power input, a power output switch, a power output, a key-switch interface and a shunt to measure the current flowing through the batteries. An exemplary integrated battery control system may be configured in a single control enclosure having attachments or ports for the inputs/outputs to simplify installation and maintenance.

In an exemplary embodiment, a battery management system measures the state of charge of the battery units. The power control system regulates electrical power delivery to a drive motor and a motor speed controller. The motor speed controller provides power to the motor and comprises a capacitor to ensure a stable power delivery to the motor. The power control system will charge this capacitor through a pre-charge resistor before power is delivered to the motor. In addition, the power control system regulates power delivery to the motor and motor speed controller as a function of the state of charge of the battery supply. If a battery unit is below a threshold value, the power control system will not allow power deliver to either the drive motor or the pre-charge resistor. In another exemplary embodiment, the power control system receives input from an AC power connection sensor that detects if an AC power source is coupled with the vehicle, such as an electrical plug being plugged into a wall outlet. When the AC power connection sensor detects that AC power is coupled to the battery powered device, the power control system will disabled power to the drive motors or motors, thereby preventing the vehicle form driving off when plugged in. One or more power output switches may be controlled by the power control system to enable and disable power delivery. The power control system is coupled with the key-switch of the vehicle and, based on the status of the batteries, may disable power delivery even if the key-switch is activated.

An exemplary integrated battery control system comprises an AC power connection sensor that detects when the AC power input is coupled with an AC power supply. An AC power connection sensor may measure an electrical input from an AC power source or charging unit, or it may detect a physical connection of the charger, such as a switch on a charger port or plug for the charging cord. For example, a golf cart may be plugged into an electrical wall outlet for the purpose of charging the batteries of the golf cart. A physical sensor may detect when an AC power supply plug is connected with the AC power input of the integrated battery control system. A switch may be triggered when a coupling plug is attached to a port on the vehicle or to the AC power input of the control enclosure. The power control system may disable power delivery to the drive motors and/or a pre-charge resistor when the AC power connection sensor detects that AC power input is coupled. An AC power connection sensor may also be an electrical sensor that detects electrical voltage, resistance or current from the AC power supply source.

An exemplary power control system determines if there are fault conditions before enabling power delivery output. A fault condition may be detection of an AC power supply coupling or detection that a battery is below a threshold value or above a threshold value, for example. A power control system may disable power delivery completely to any output or disable power to one or more output locations, such as a drive motor and/or a pre-charge resistor.

In an exemplary embodiment, a battery unit is monitored by a battery management system that is coupled to battery unit monitoring modules through any suitable means. The battery management system, or a portion thereof, may be configured in a control housing of the integrated battery control system. Wires may couple the battery management system with the battery unit monitoring modules. In another embodiment, the battery unit monitoring modules communicate battery data wirelessly to the battery management system, such as described in U.S. patent application Ser. No. 14/657,248, entitled Wireless Battery Management System, to Yuan Dao, et al.; the entirety of which is incorporated by reference herein. The battery management system may be configured to monitor the voltage and/or temperature of each battery in the battery unit or pack. A battery management system can include battery unit monitoring modules for obtaining data about battery units in a battery pack. A switched capacitor battery unit monitoring module, as described in U.S. patent application Ser. No. 14/657,972, entitled Switched Capacitor Battery Unit Monitoring System, to Yuan Dao, et al.; the entirety of which is incorporated by reference herein, may be incorporated into the integrated battery management system, as described herein.

In an exemplary embodiment, a battery management system uses a relay method for retrieving battery data. A computing device can obtain the data by sending a data request to the first monitoring module. The first monitoring module obtains and transmits data about its connected battery unit to the computing device and sends a data request to the second monitoring module. The second monitoring module obtains and transmits data about its connected battery to the computing device and sends a data request to the next monitoring module. Each successive monitoring module performs the same steps until all the monitoring modules have sent data about their connected battery units to the computing device. This relay method, or daisy-chain communication method allows a computing device to receive data from all of the battery unit monitoring modules with a single data request.

The sequence of receipt of the data is correlated by the computing device to the specific battery unit from which is was received. This greatly simplifies monitoring of the batteries and greatly simplifies and reduces wiring requirements. Thus, the computing device needs solely a single data request port and single input data port to obtain the data for a battery pack.

In one aspect, the present disclosure describes a battery management system. The battery management system includes a computing device with an output data request port and an input data port. The battery management system also includes first and second battery unit monitoring modules, each battery unit monitoring module may be coupled to the input data port of the computing device through a single physical connection, or from a single wireless transmitter. In response to a data request from the output data request port of the computing device, the first battery unit monitoring module transmits data of the first battery unit to the input data port of the computing device, and transmits a data request to the second battery unit monitoring module. In response to the data request from the first battery unit monitoring module, the second battery unit monitoring module transmits data of the second battery unit to the input data port of the computing device through a common connection of the first battery unit monitoring module. The computing device can include an analog-to-digital converter that measures a voltage across the first and second battery units. The computing device can include an analog-to-digital converter that measures a current flowing in the first and second battery units.

The first battery unit monitoring module can connect to a first battery unit in a battery pack of an electric vehicle. The battery management system can also include wiring connecting the computing device to the battery unit monitoring modules. Because the battery units in a battery pack can be wired in series, the physical locations of the positive and negative terminals arranged in an alternating fashion, the second battery unit monitoring module is oriented in an opposite direction from the first battery unit monitoring module. The first battery unit monitoring module can include an analog-to-digital converter. The analog-to-digital converter can measure a voltage of the first battery unit. The first battery unit monitoring module can include a temperature monitoring device that measures a temperature of the first battery unit. The temperature can be expressed as a voltage which is applied to an input of the analog-to-digital converter. Data of the first battery unit can be a voltage and a temperature of the first battery unit. Data of the second battery unit can be a voltage and a temperature of the second battery unit.

In an exemplary embodiment, the computing device of the battery management system can automatically initiate collection of data from the battery unit monitoring modules. In one embodiment, a computing device will send a data request to the first battery unit monitoring module after the computing device has not received data on the input data port for a predetermined period of time. Since data is automatically sent sequentially to the input data port from the battery unit monitoring modules until the last battery unit monitoring module sends data, the extended delay in receiving data is a signal to the computing device to re-initiate collection of data. The predetermined period of time may be any suitable amount of time, such as 20 ms, 40 ms, 50 ms, and the like.

The computing device can output an alarm when an error condition is detected. The error condition can be a high voltage condition, a low voltage condition, a high current condition, a high temperature condition, or a connection fault condition. The computing device can shut off a battery charger when the computing device detects a high voltage condition across the first and second battery units. The computing device can shut off a motor controller when the computing device detects a low voltage condition across the first and second battery units. The battery management system can include a monitor, such as a video monitor, that displays the data of the first and second battery units. The battery management system can include a connection fault detector that detects a connection between a node at a zero voltage reference level and the first and second battery units. The battery management system can include one or more battery unit balancing systems, each system balancing charge in a battery unit.

In another aspect, the present disclosure describes a battery management system with a computing device and first and second battery unit monitoring modules. The computing device includes a first output data request port and an input data port. The first battery unit monitoring module includes a first input data request port connected to the output data request port of the computing device, a first output data port connected to the input data port of the computing device, and a second output data request port. The second battery unit monitoring module includes a second input data request port connected to the second output data request port of the first battery unit monitoring module, and a second output data port connected to the input data port of the computing device.

In another aspect, the present disclosure describes a method of managing a battery. The method includes transmitting, by a computing device, a first data request to a first battery unit monitoring module. The method also includes transmitting, by the first battery unit monitoring module, data of a first battery unit to an input data port of the computing device in response to the first data request. The method also includes transmitting, by the first battery unit monitoring module, a second data request to a second battery unit monitoring module. The method also includes transmitting, by the second battery unit monitoring module, data of a second battery unit to the input data port of the computing device in response to the second data request A power control system, as described herein, may comprises a plurality of lithium batteries. Any suitable number of batteries may be configured in a battery unit or battery pack including, but not limited to, two or more, three or more, four or more, six or more, ten or more, twenty or more and any range between and including the quantities provided. Power is drawn from a battery pack and a battery pack may comprise any number of battery units. A battery unit comprises two or more lithium batteries that may be configured in series or in parallel. In an exemplary embodiment a battery pack comprises two battery units, each battery unit comprising four lithium batteries in series. Each lithium battery may be maintained in a stand-by condition, or charge of approximately 3.375 volts, for example, to ensure an output voltage of 3.0 volts per battery on average when the battery pack is required for back-up power. This battery pack, having a ready voltage of 27 volts, may be used in an power control system that is configured to provide a 24V output, for example. The power output regulator, of this example power control system, may regulate the power delivered to any suitable voltage, such as 24V, thereby ensuring a constant and steady power supply.

A lithium battery, as used herein, comprises lithium metal or lithium compounds in the anode. Lithium batteries have a very high charge density or long life, and can operate at temperature extremes. The lifetime of a lithium battery may be as much as ten times greater than a lead-acid battery. In addition, lead-acid batteries have a somewhat limited effective operating temperature range. Lithium batteries can produce voltages from 1.5 to 3.7V.

The power control system is configured to monitor and control the supply of output power. An exemplary power control system comprise a battery power input and an AC power input, whereby leads from a battery pack and an AC power supply can be connected, respectively. An exemplary power control system may also comprise an AC power supply sensor that is configured to monitor the incoming AC power. A power output switch may be controlled by a computing device that monitors the system by receiving input data and utilizing control programs for operating the system.

Output power may be delivered by the battery pack until a low voltage threshold is reached by a battery unit, or individual battery within the battery pack, or when the battery pack drops below a threshold voltage. The power control system may provide an alert that the battery power is approaching a low threshold value. An operator of the vehicle may return to a charging station and couple the vehicle with an AC power supply. The battery pack may then begin to be charged back to a full voltage state.

An exemplary power control system may also comprise a power output connector, such as a plug, whereby an external device requiring an electrical power supply can be connected. Any number of power output connectors may be configured on a power control system, such as one, two, three, five, more than five and the like.

A battery monitoring module is coupled to each of the batteries for direct monitoring of battery status data, such as voltage and in some cases temperature of the battery, and may a thermistor. A battery monitoring module may comprise a voltage dividing network for the purpose of measuring the battery voltage. A battery monitoring module may comprise an analog-to-digital converter that measures a voltage of said batteries. In an exemplary embodiment, a battery monitoring module is connected between a positive and negative terminal of a battery and is physically located on the battery. A module connector may couple a first battery monitoring module to a second battery monitoring module. In embodiments with a larger number of individual batteries in a battery unit, a plurality of module connectors may be configured in a daisy-chain from one battery to the next.

In an exemplary embodiment, an integrated battery control system comprises a wireless battery management system, as described in U.S. patent application Ser. No. 14/657,248, to Yuan Dao, et al. A physical cable may be coupled between the battery monitoring module and the battery data input for the transfer of data and requests. In an alternative embodiment, a wireless transmitter may transmit a request for data or send data, and a wireless receiver may be configured for receipt of this information. A wireless transmission system for receiving battery data from a battery unit monitor module is described in U.S. patent application Ser. No. 14/225,251, filed on Mar. 25, 2014, entitled Uninterrupted Lithium Battery Power Supply System; the entirety of which is incorporated by reference herein. A wireless transmitter may be coupled with the computing device and may send a request for battery monitoring module data. A wireless receiver coupled with a first battery monitoring module may receive this request and may then send data about the first battery and/or battery unit to the battery data input through a wireless transmitter. Again, a wireless signal receiver may be coupled with the battery data input to provide this data to the computing device. Any suitable configuration of wireless receivers and transmitters may be used to reduce the number of physical connections between a battery pack and a power control system. A battery data input may be coupled to a battery monitoring module through a cable or wirelessly. A battery data input may comprise a wireless signal receiver that is configured to receive a wireless signal having battery unit parameter data. A wireless signal generator may be coupled with a battery monitoring module. Likewise, a data request output may comprise a wireless signal that is received by a wireless signal receiver of a battery monitoring module.

An exemplary battery management system, as described herein, comprises a battery data input coupled with said battery monitoring modules, and computing device coupled with a data request output, and the data input. In an exemplary embodiment, a battery management system comprises a charging circuit coupled with the batteries or battery units to provide a charging current from said AC power input when a voltage of one of said batteries or battery units drops below a threshold value. A threshold value may be input during instillation by an operator of the system or at the manufacturer prior to delivery and may be stored by the computing device. A threshold value may be 3.2V or more, 3.3V or more, 3.4V or more, 3.5V or more and any value between and including the threshold values provided.

A power control system, as described herein, may comprise a battery balancing system as described in U.S. Pat. No. 8,732,482 entitled Battery Unit Balancing System, to Dr. Dao, which is hereby incorporated by reference herein in its entirety.

In an exemplary embodiment, a power control system comprises a program to determine the state of charge of a battery unit or battery, or the amount of available charge remaining. The calculation takes into account the battery unit or pack voltage prior to the utilization of battery power as the output power. The program utilizes input related to the power being drawn by the powered device, such as current, voltage and time, and calculates the total power usurped from the battery pack. The program can then calculate the discharge percent of the battery pack, as depicted in FIG. 1. A power control system may calculate the time remaining before the battery pack is discharged 80% and may send an alert via a data transmission system of the remaining time before shut-down. A power control system may shut-down the battery pack if a discharge level of 80% or more is reached, for example, in an effort to protect the system and prevent damage to the battery pack.

A power control system, as described herein, may be configured, or programmed, to send a signal via a data transmission system to an external device. For example, a phone call, text message, email alert, or any other suitable signal, such as a signal configured to be received by a monitoring station, may be sent when an error, limit value or emergency level value is detected. For example, a battery monitoring module may measure and monitor temperature of individual batteries and may detect a temperature above a threshold or emergency limit set in the computing device. When the computing device receives this data, a signal may be sent via the data transmission system regarding the over-temperature condition. The power control system may be configured to send a special signal in the event of any out of limit condition detected including, a high voltage condition, low voltage condition, high current condition, low current condition, high temperature condition, loss of AC power, loss of output power or a connection fault condition. A power control system, as described herein, may be configured to shut off battery charging when the computing device detects a high voltage condition on a battery or battery unit. In another embodiment, a power control system, as described herein, may be configured to discontinue power draw from a battery unit in the event of a low voltage condition.

The summary of the invention is provided as a general introduction to some of the embodiments of the invention, and is not intended to be limiting. Additional example embodiments including variations and alternative configurations of the invention are provided.

BRIEF DESCRIPTION OF THE DRAWINGS

The accompanying drawings are included to provide a further understanding of the invention and are incorporated in, and constitute a part of this specification, illustrate embodiments of the invention and together with the description serve to explain the principles of the invention.

DETAILED DESCRIPTION OF THE ILLUSTRATED EMBODIMENTS

Figure 1:
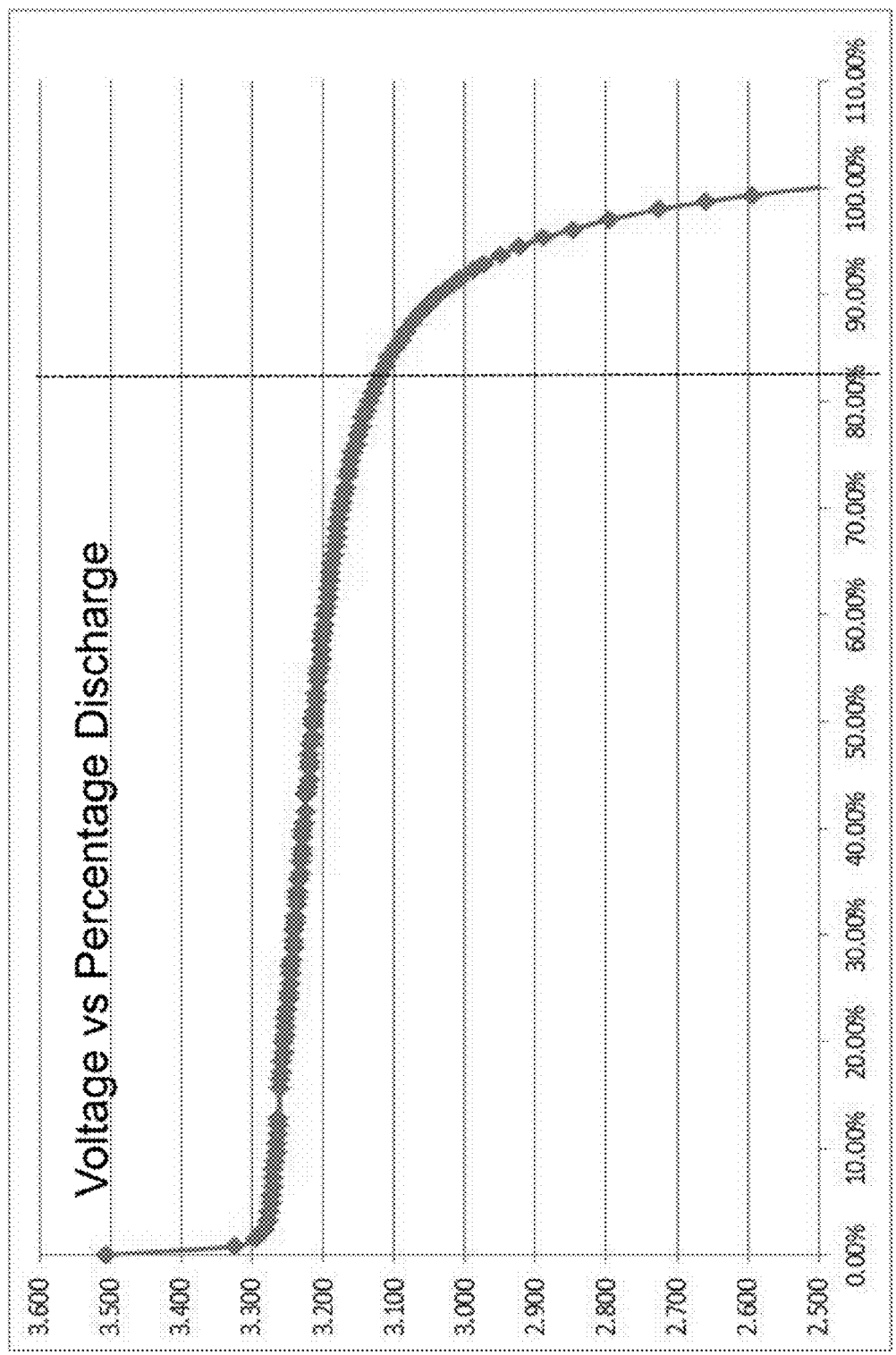

FIG. 1 shows an exemplary discharge profile for a lithium battery.

Figure 2:
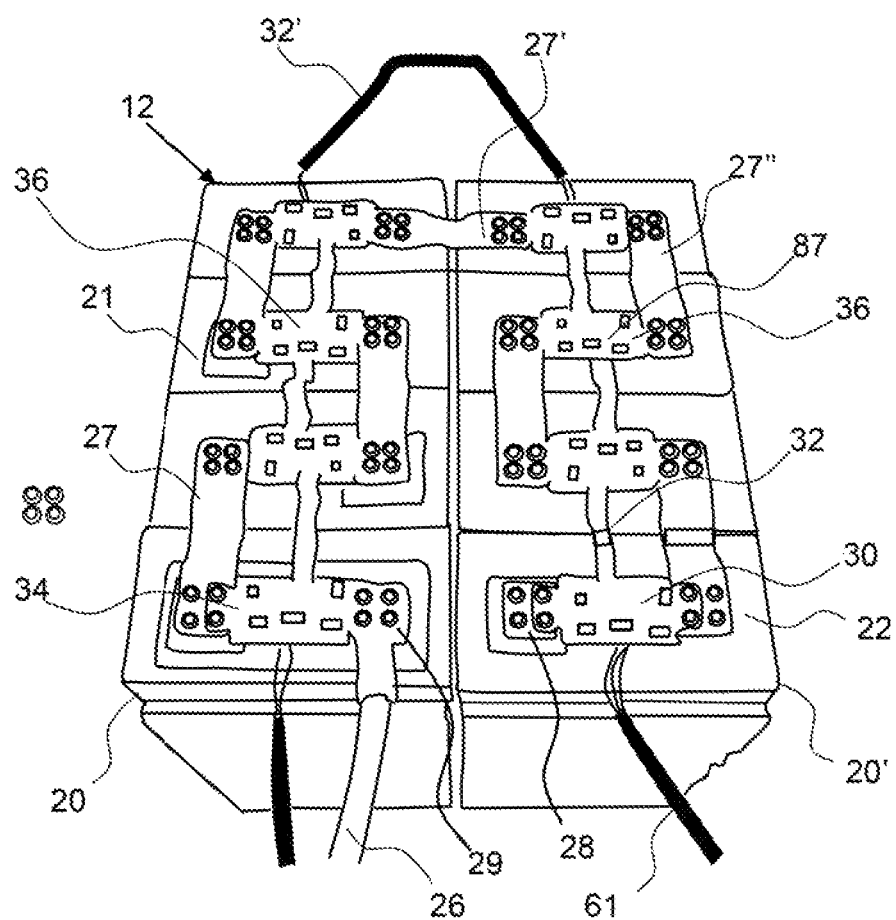

FIG. 2 shows a top-down view of an exemplary battery pack with battery monitoring modules configured thereon.

Figure 3:
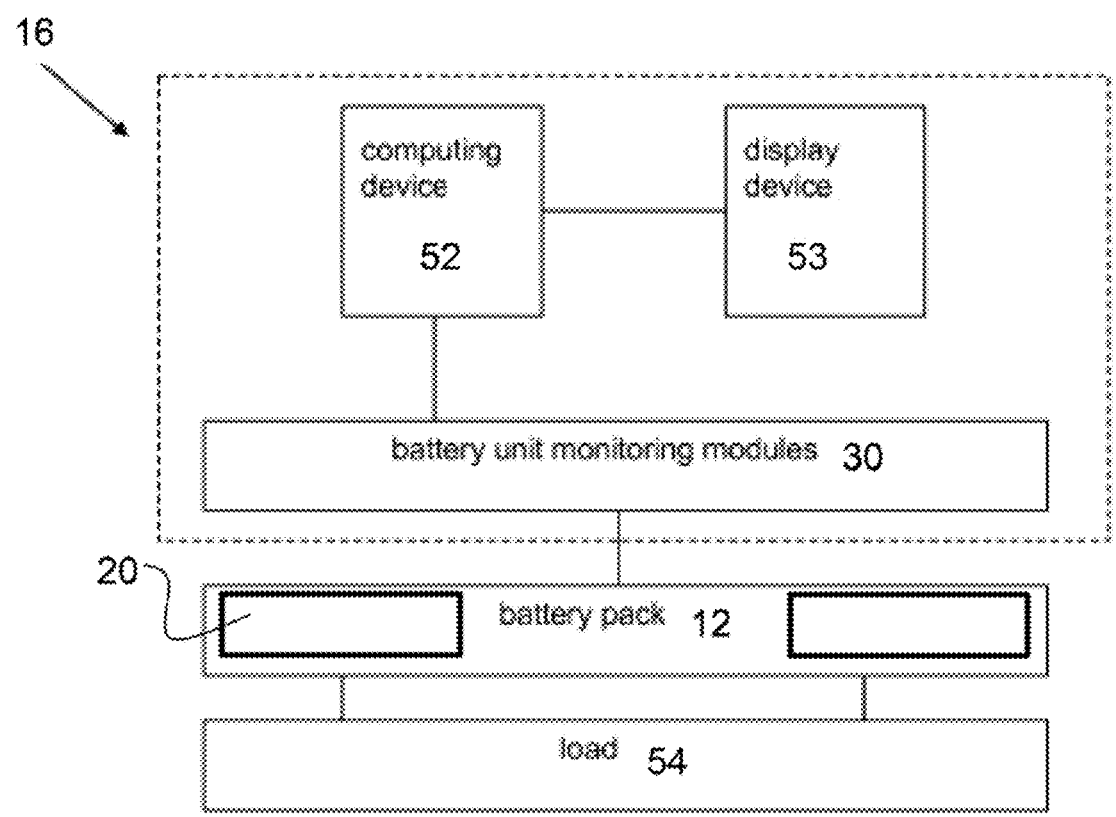

FIG. 3 shows a block diagram depicting an exemplary embodiment of a battery management system connected to a battery pack.

Figure 4:
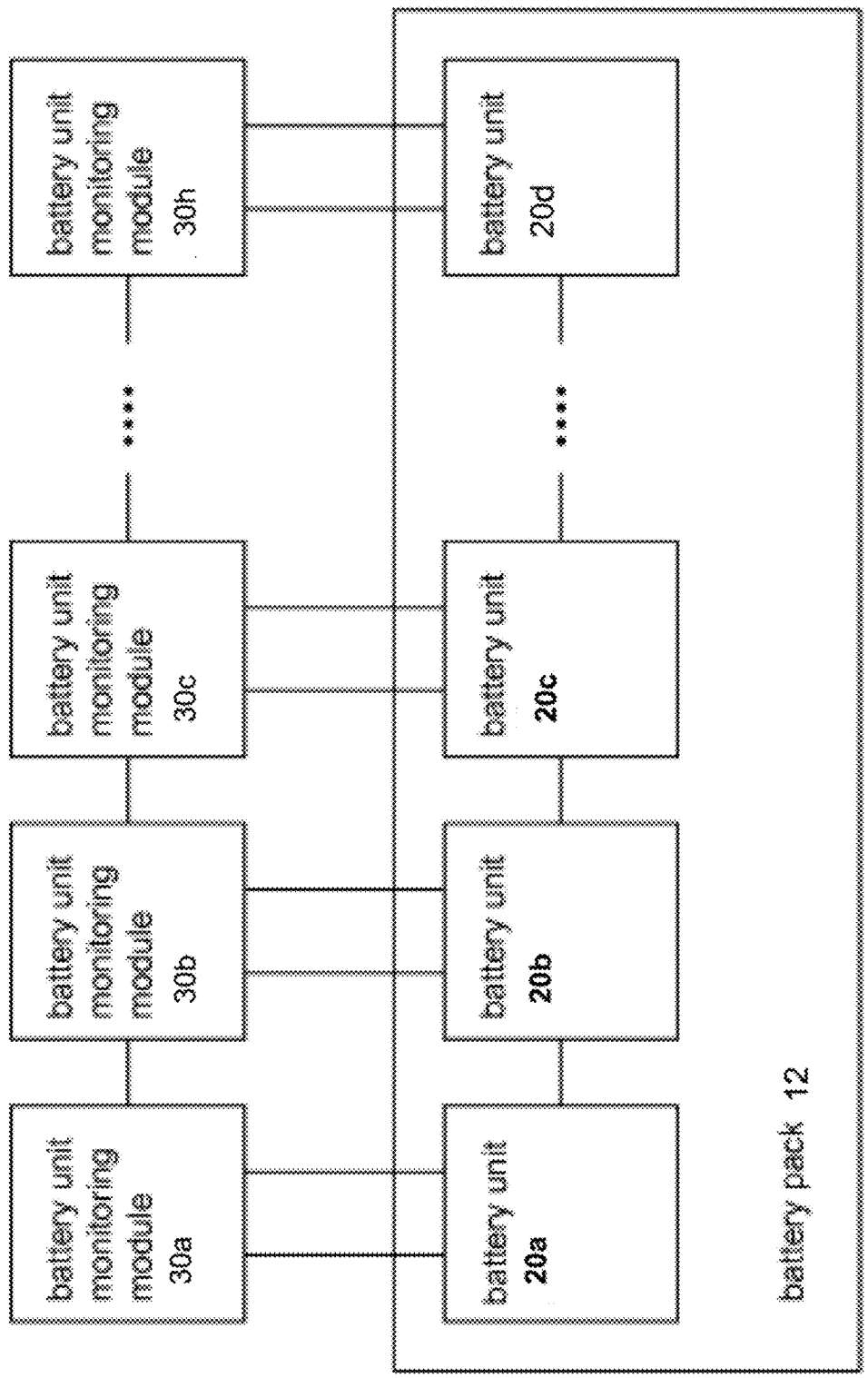

FIG. 4 shows a block diagram depicting an exemplary arrangement of battery unit monitoring modules of the battery management system with respect to the battery units of the battery pack.

Figure 5:
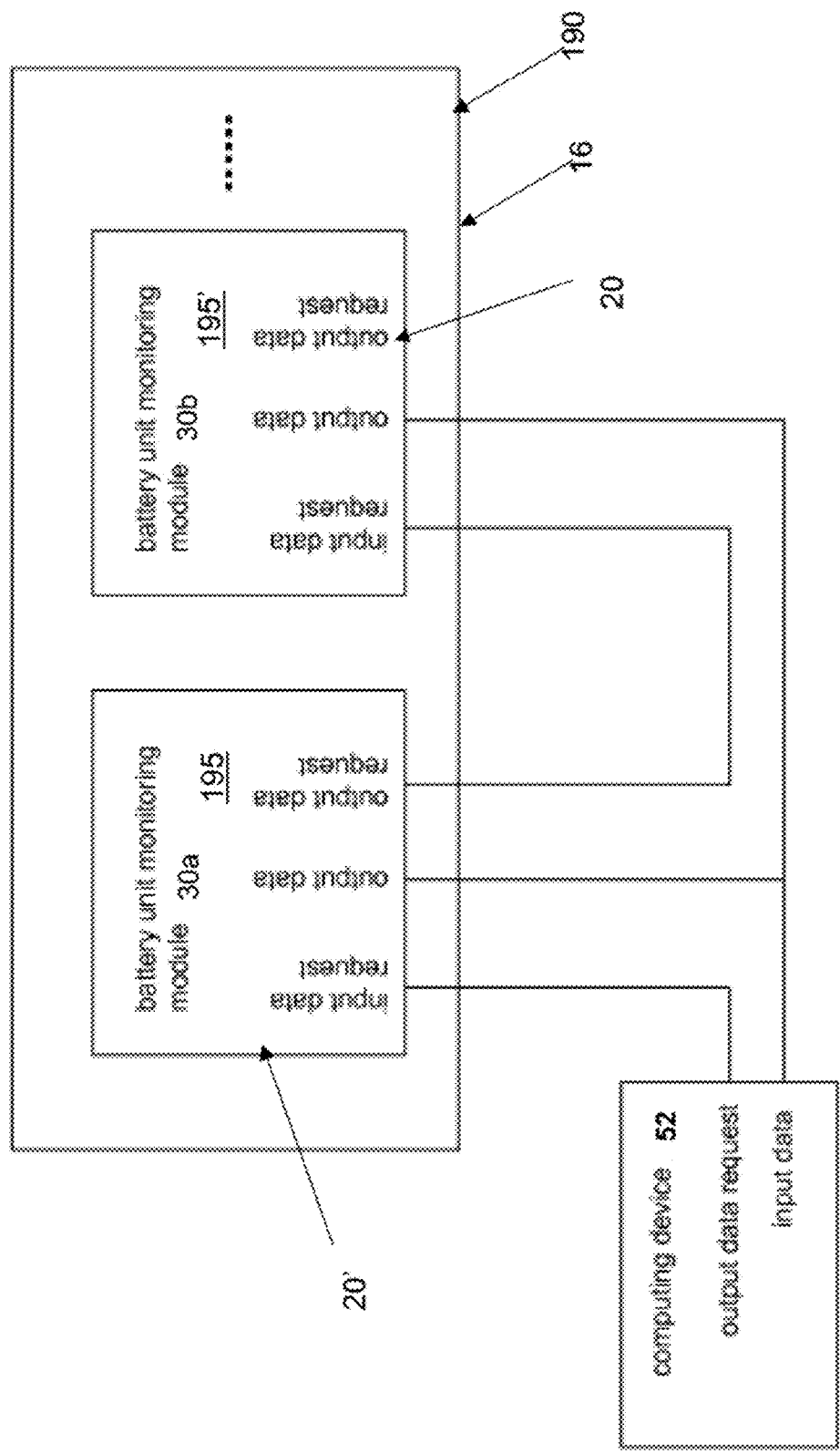

FIG. 5 shows a block diagram depicting connections within the battery management system between the computing device and the battery unit monitoring modules.

Figure 6:
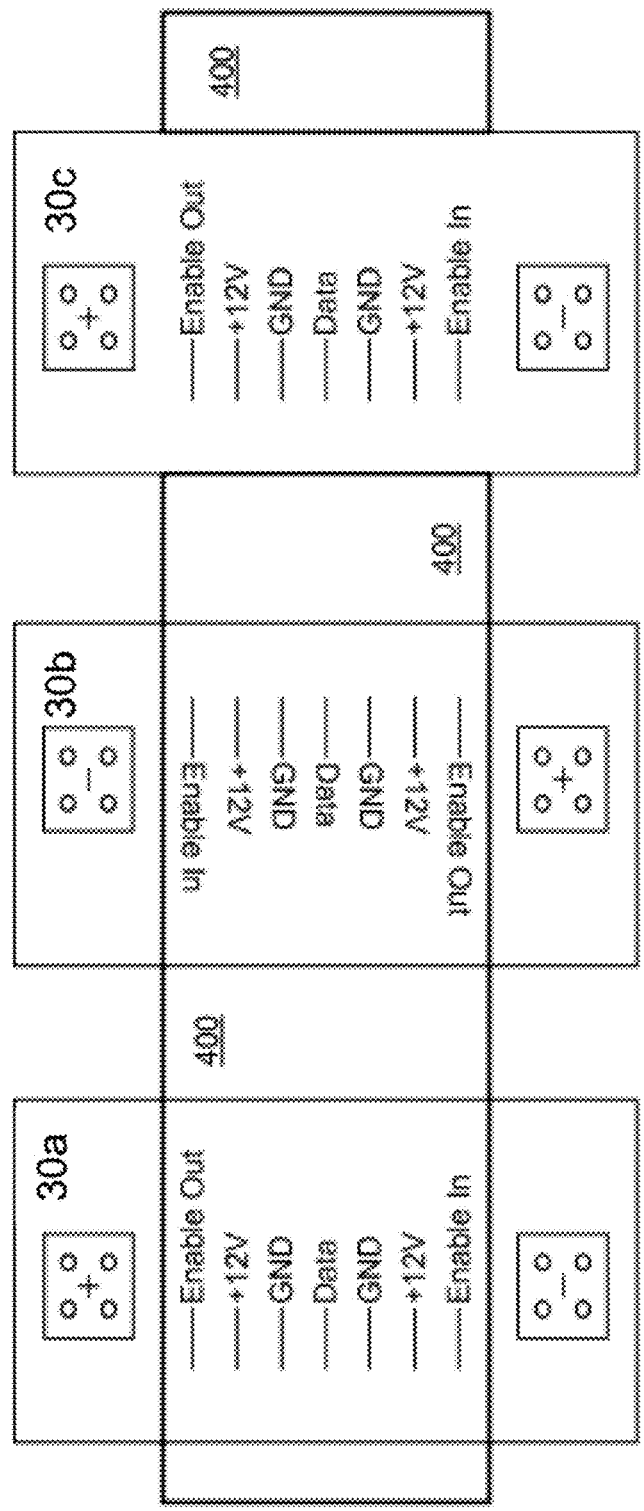

FIG. 6 shows a diagram depicting connections between battery unit monitoring modules.

Figure 7:
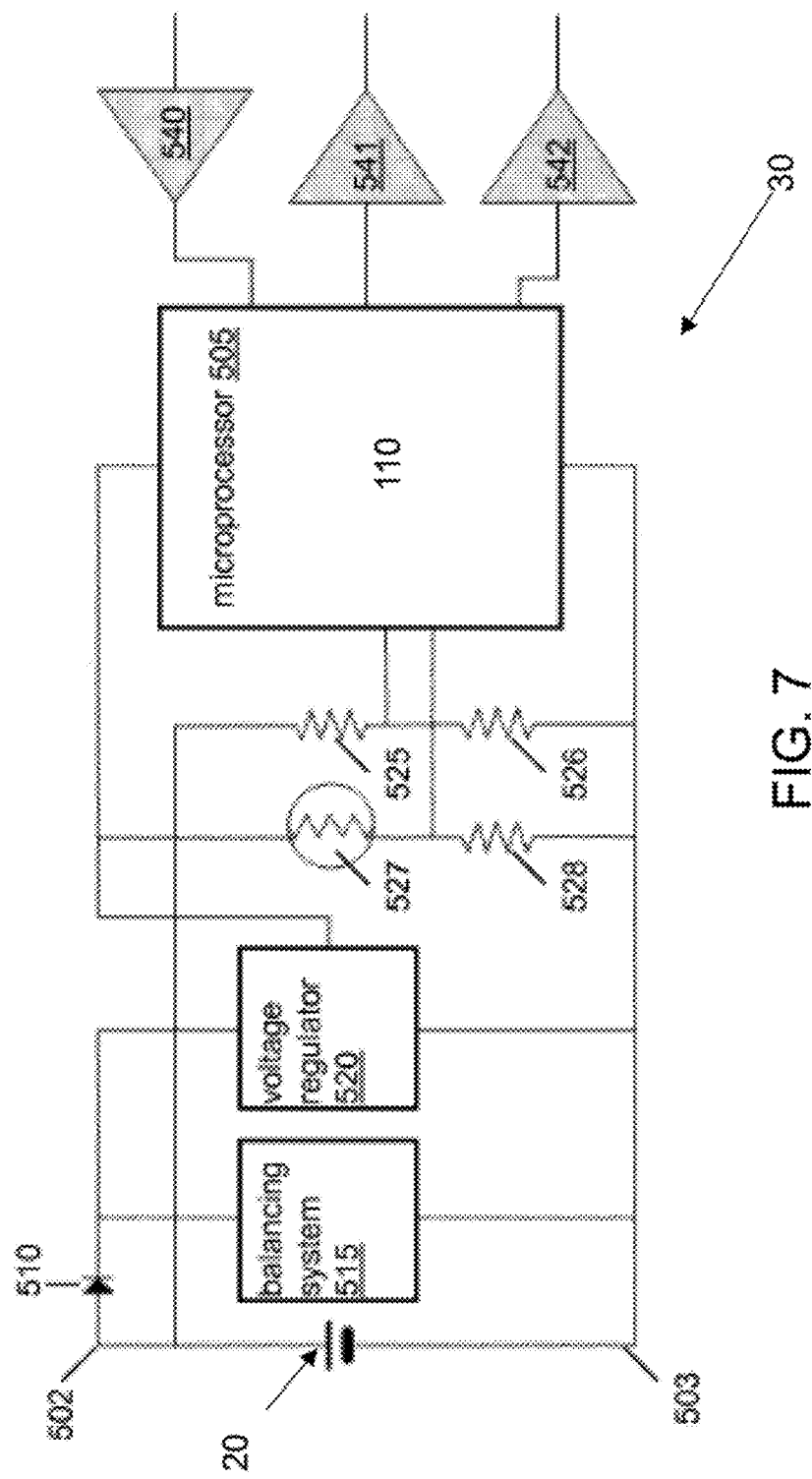

FIG. 7 shows a hybrid block and circuit diagram depicting an exemplary battery unit monitoring module.

Figure 8:
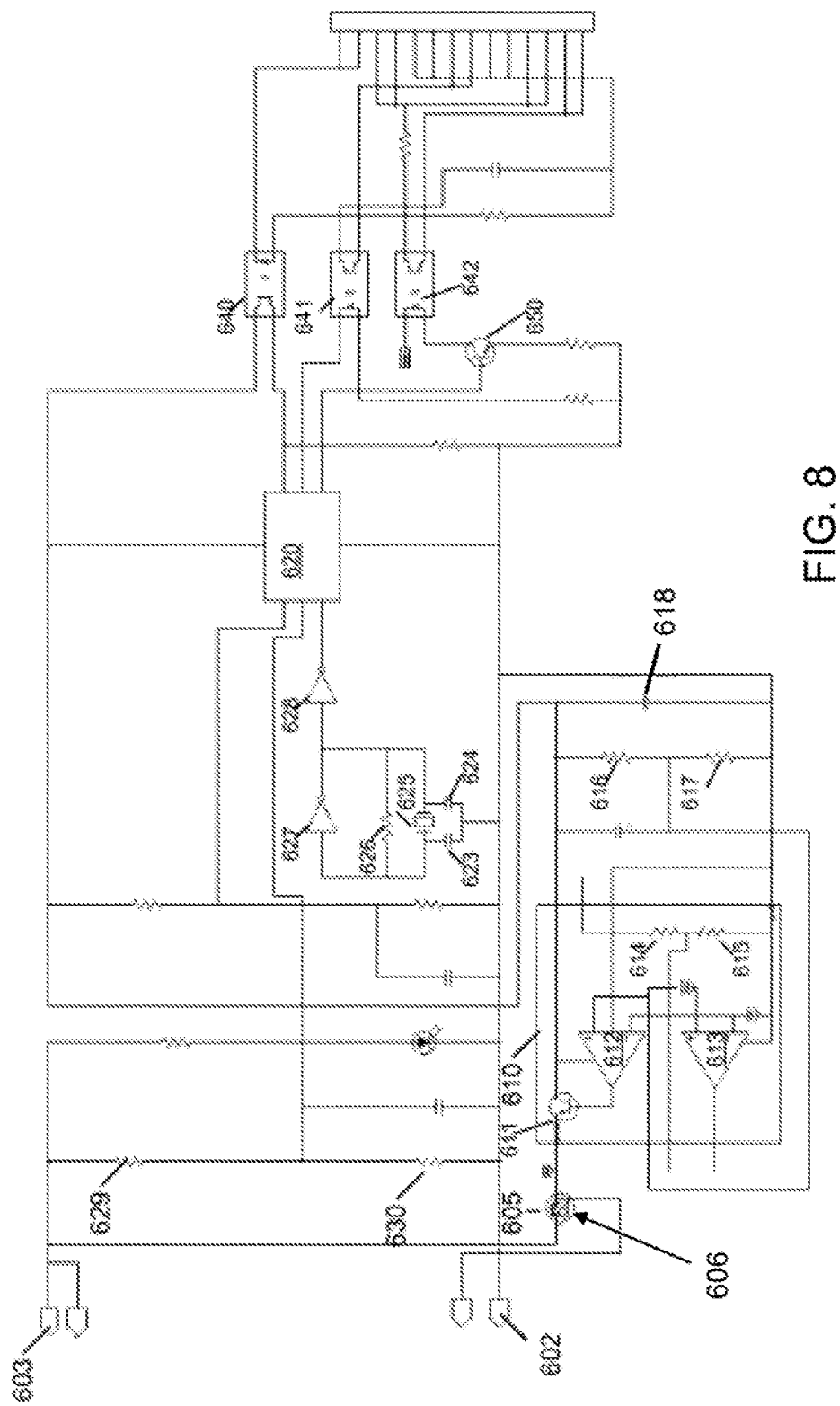

FIG. 8 shows a circuit diagram of an exemplary embodiment of a battery unit monitoring module.

Figure 9:
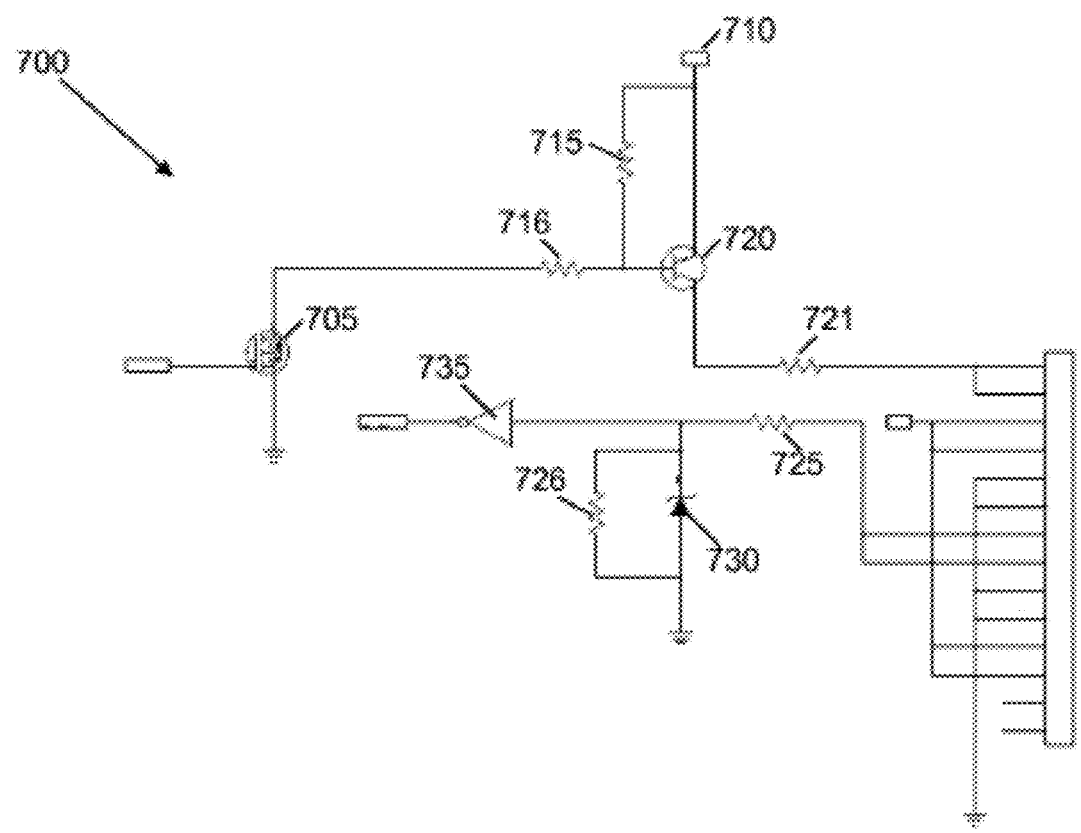

FIG. 9 shows a circuit diagram of an exemplary embodiment of the interface for a computing device.

Figure 10:
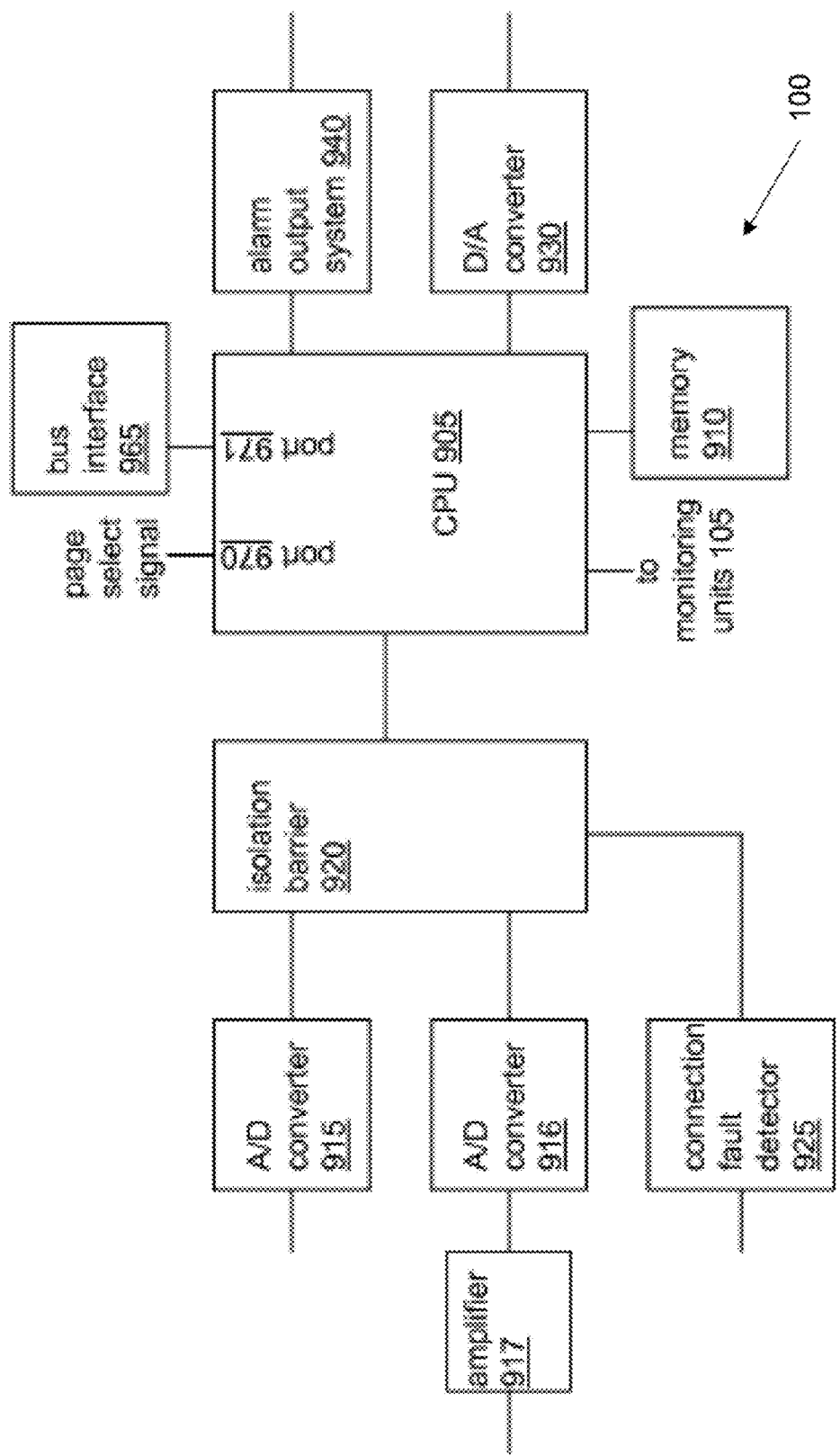

FIG. 10 shows a block diagram depicting an exemplary embodiment of the computing device of the battery management system.

Figure 11:
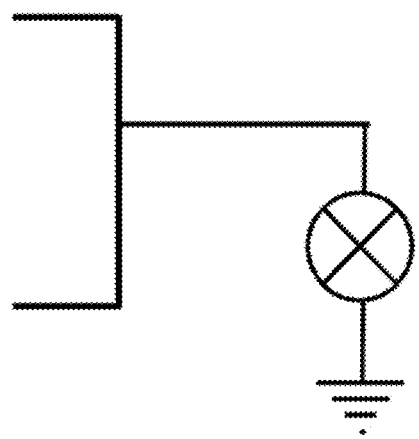
Figure 11:
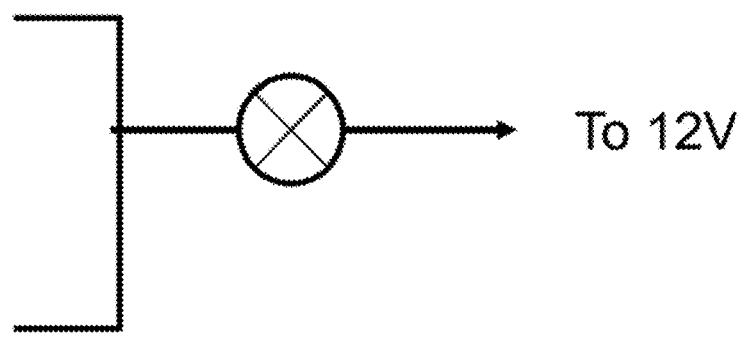

FIG. 11 shows a block diagram depicting an exemplary embodiment of the alarm output system of the computing device.

Figure 12:
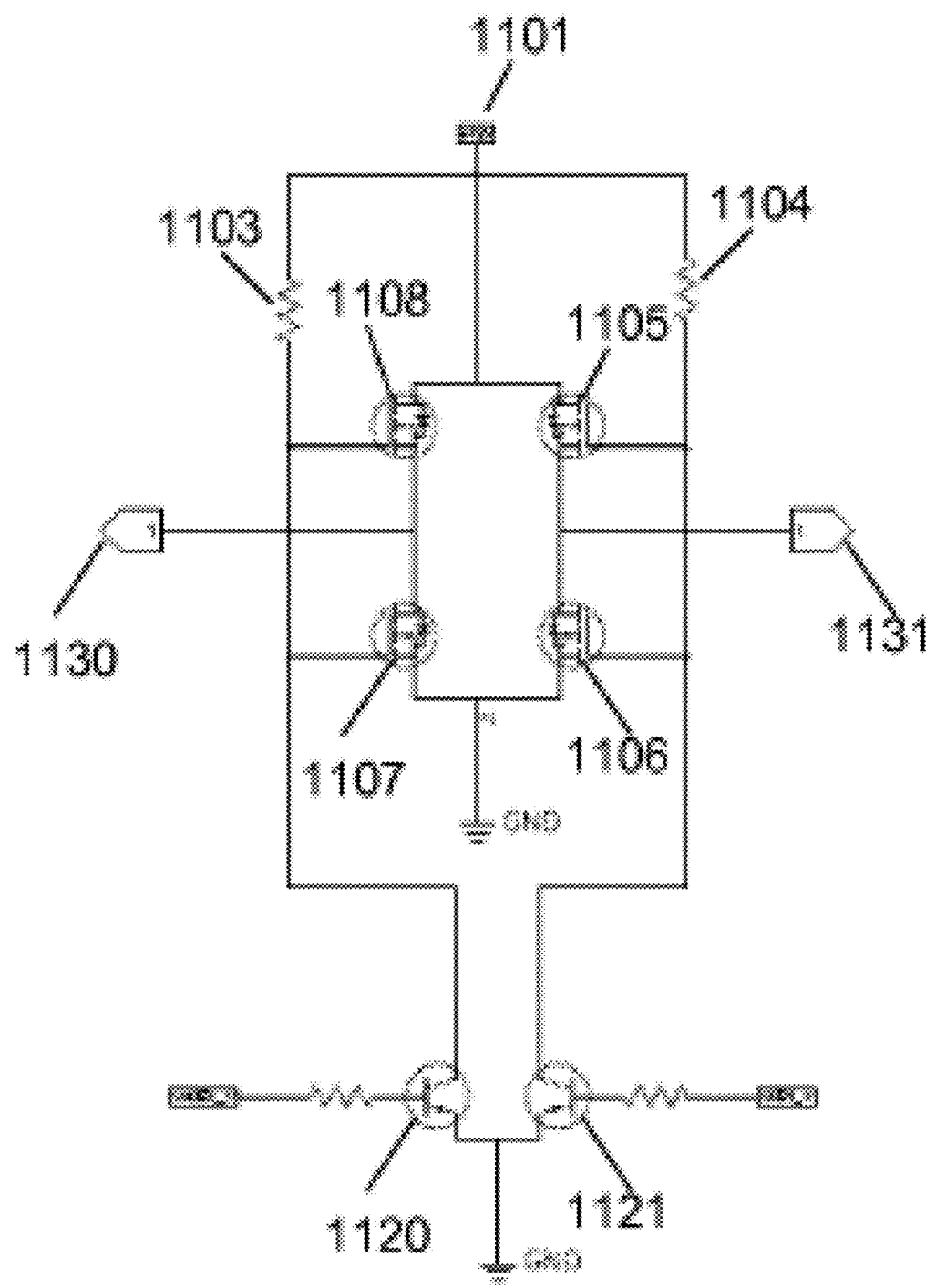

FIG. 12 shows a circuit diagram depicting an exemplary embodiment of the alarm output system of the computing device.

Figure 13:
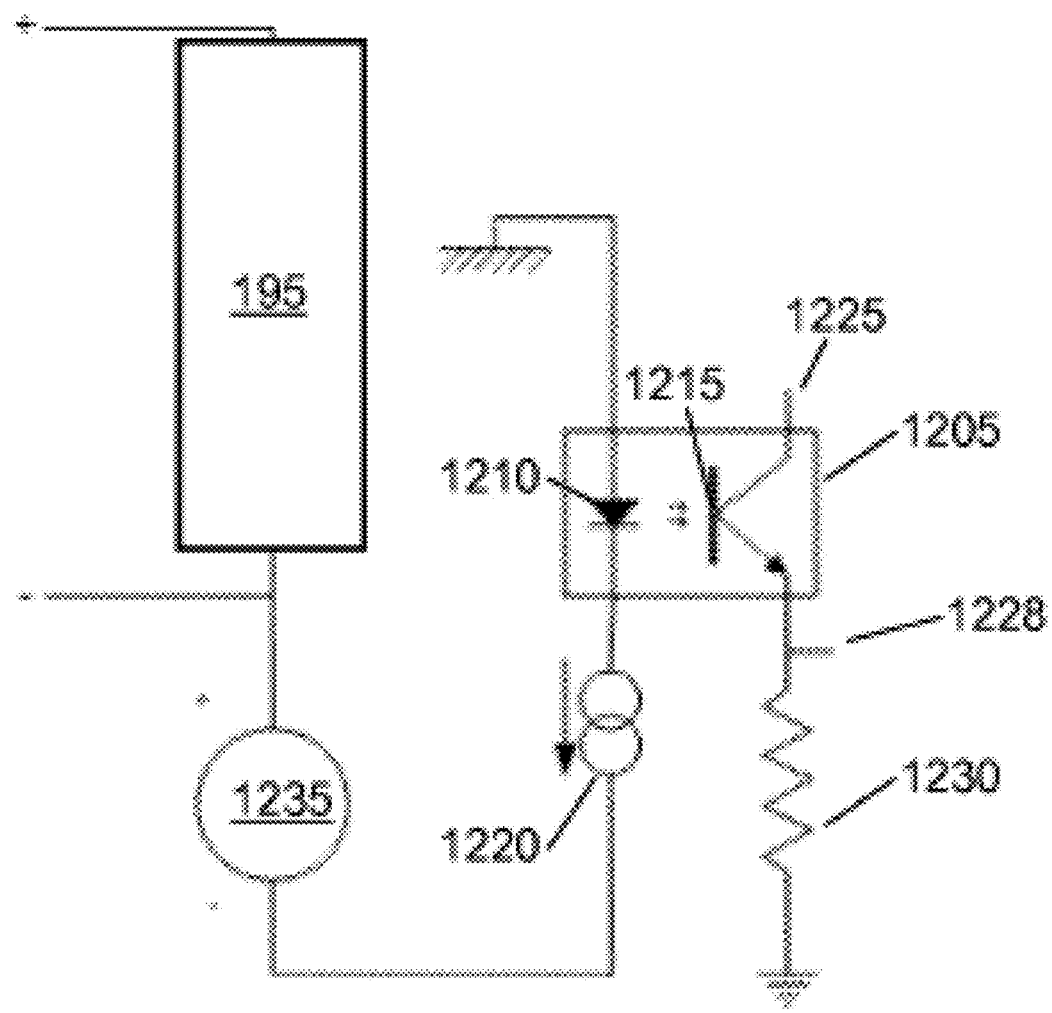

FIG. 13 shows a block diagram depicting an exemplary embodiment of the connection fault detection system of the computing device.

Figure 14:
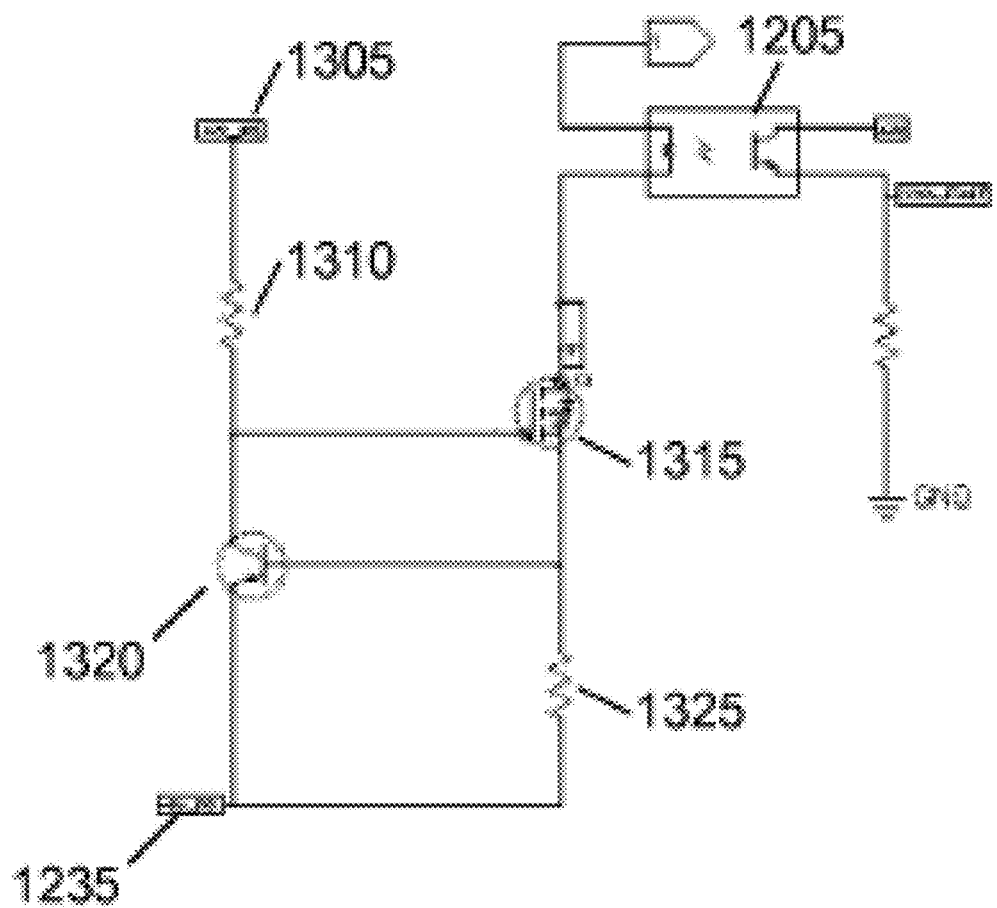

FIG. 14 shows a circuit diagram depicting an exemplary embodiment of the connection fault detection system of the computing device.

Figure 15:
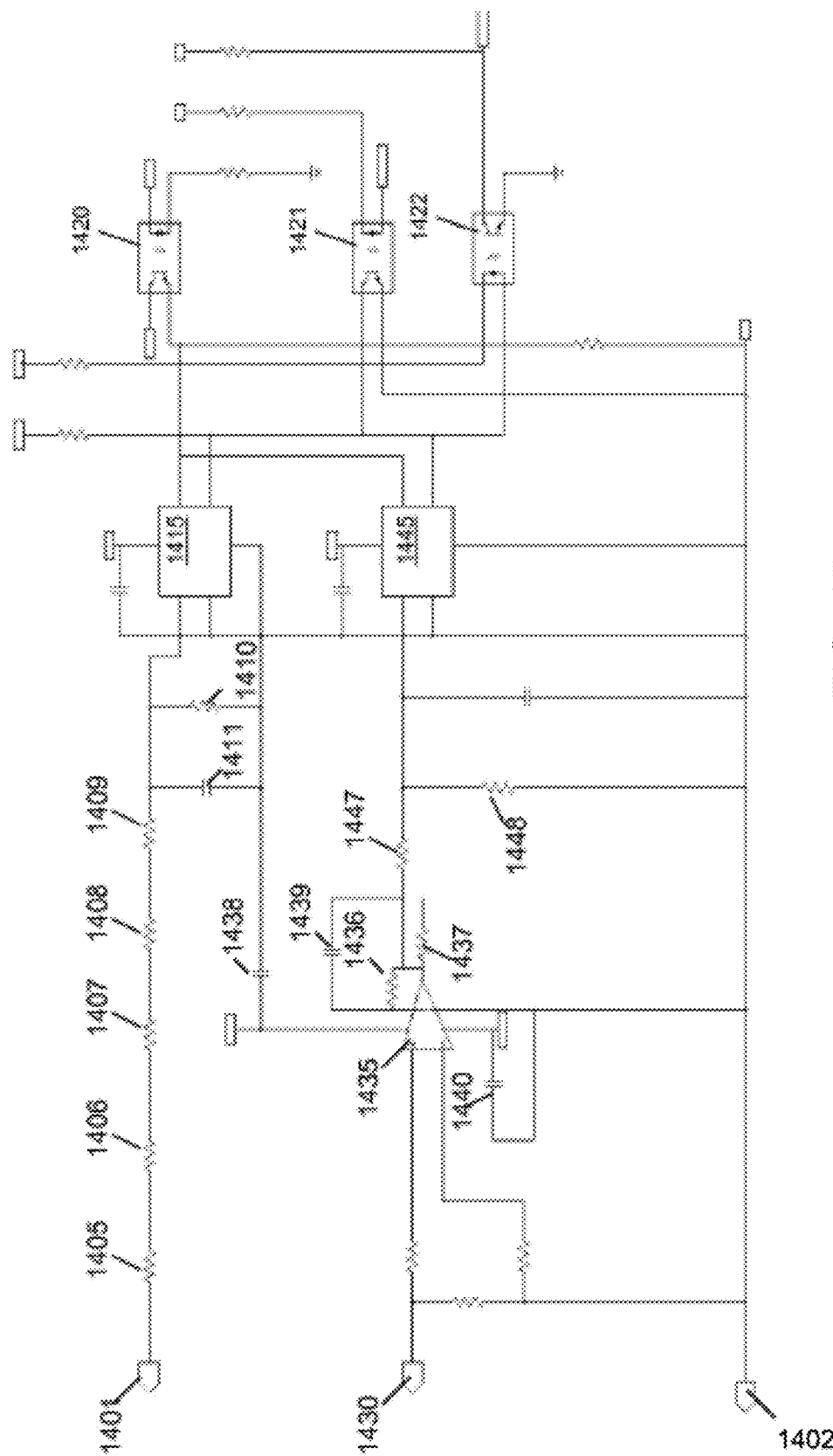

FIG. 15 shows a circuit diagram depicting an exemplary embodiment of the pack voltage and pack current input systems of the computing device.

Figure 16:
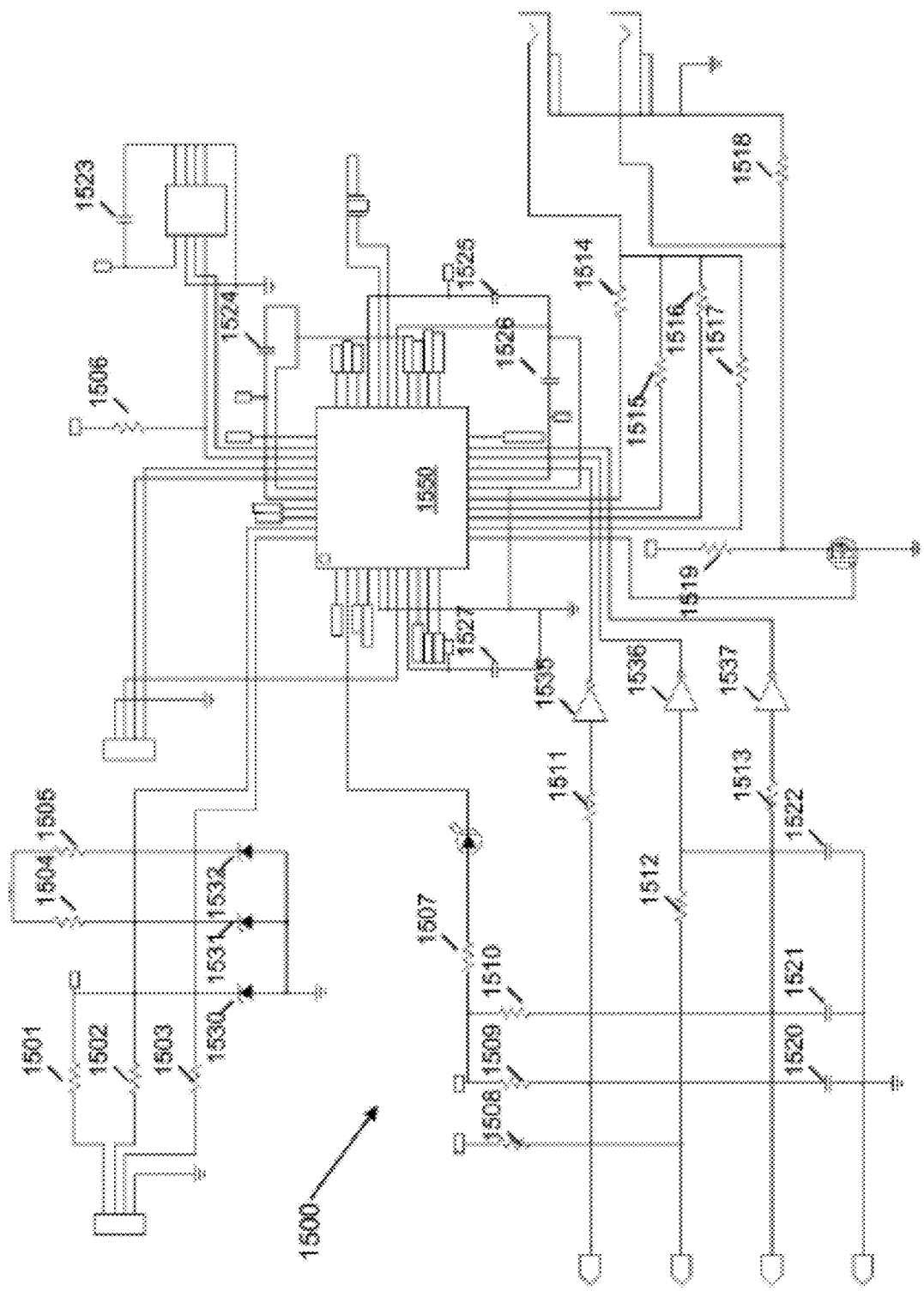

FIG. 16 shows a circuit diagram depicting an exemplary embodiment of the processor of the computing device.

Figure 17:
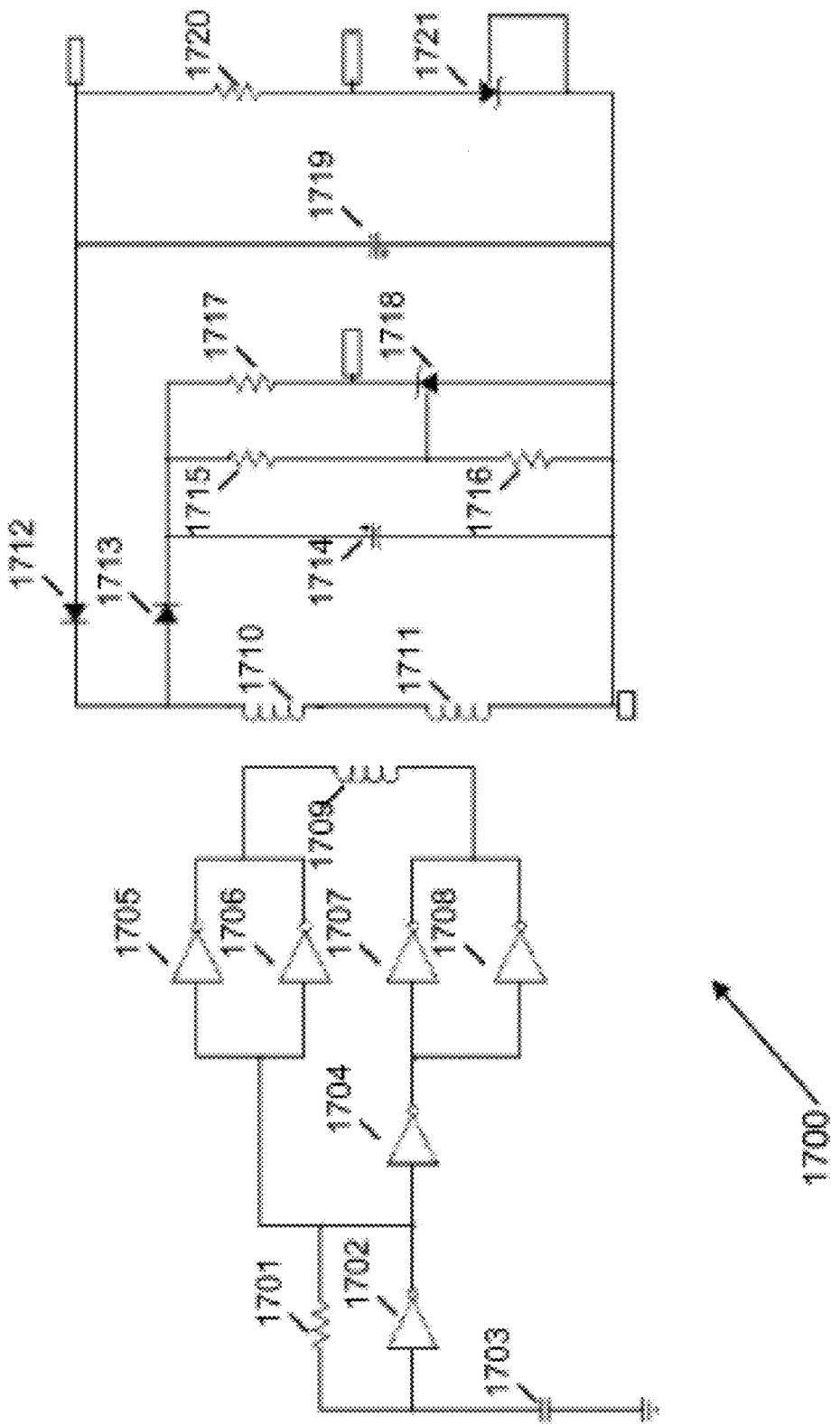

FIG. 17 shows a circuit diagram depicting an isolated power supply to power the circuits of FIG. 15.

Figure 18:
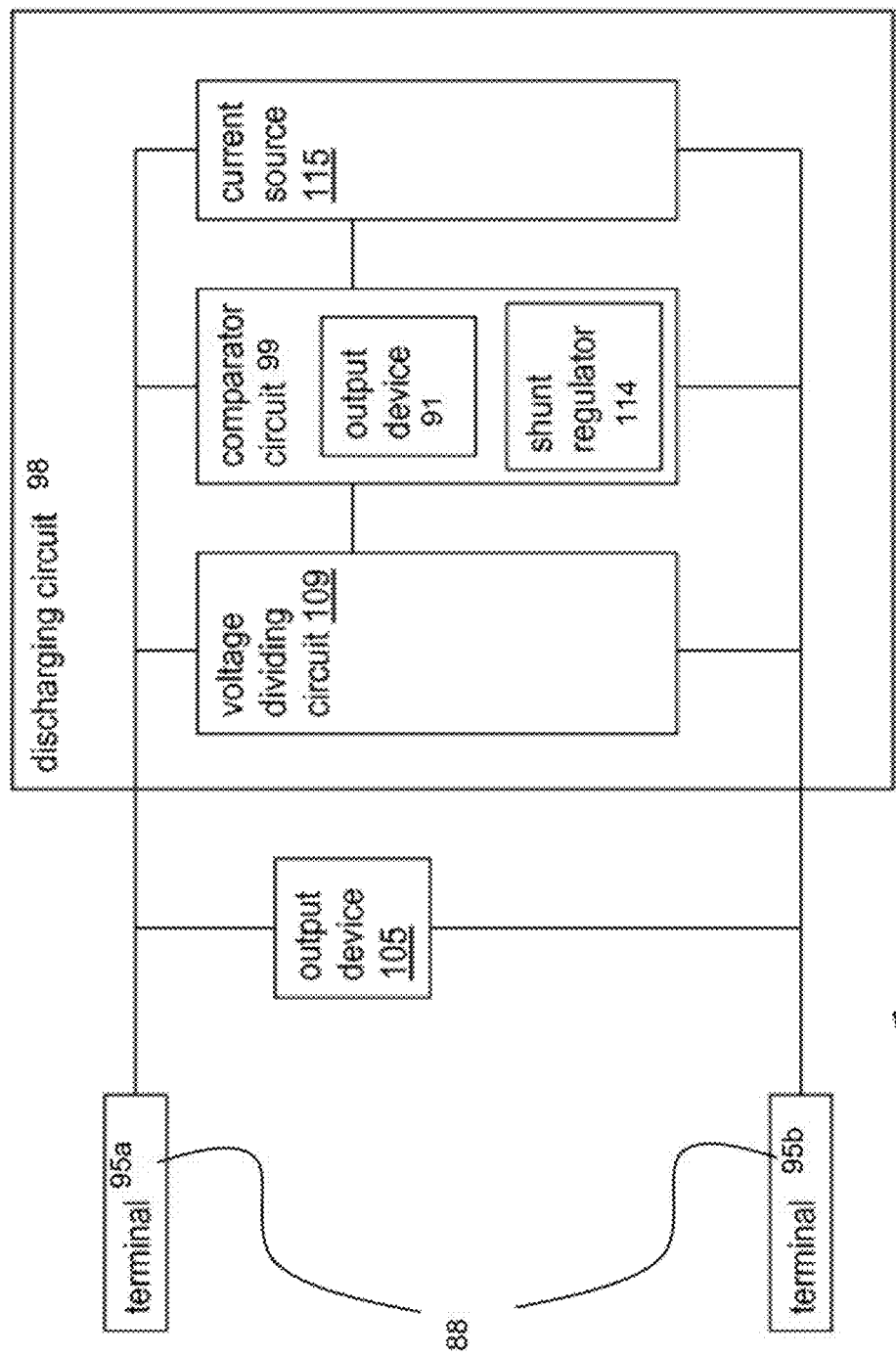

FIG. 18 is a block diagram of an embodiment of a battery unit balancing system.

Figure 19:
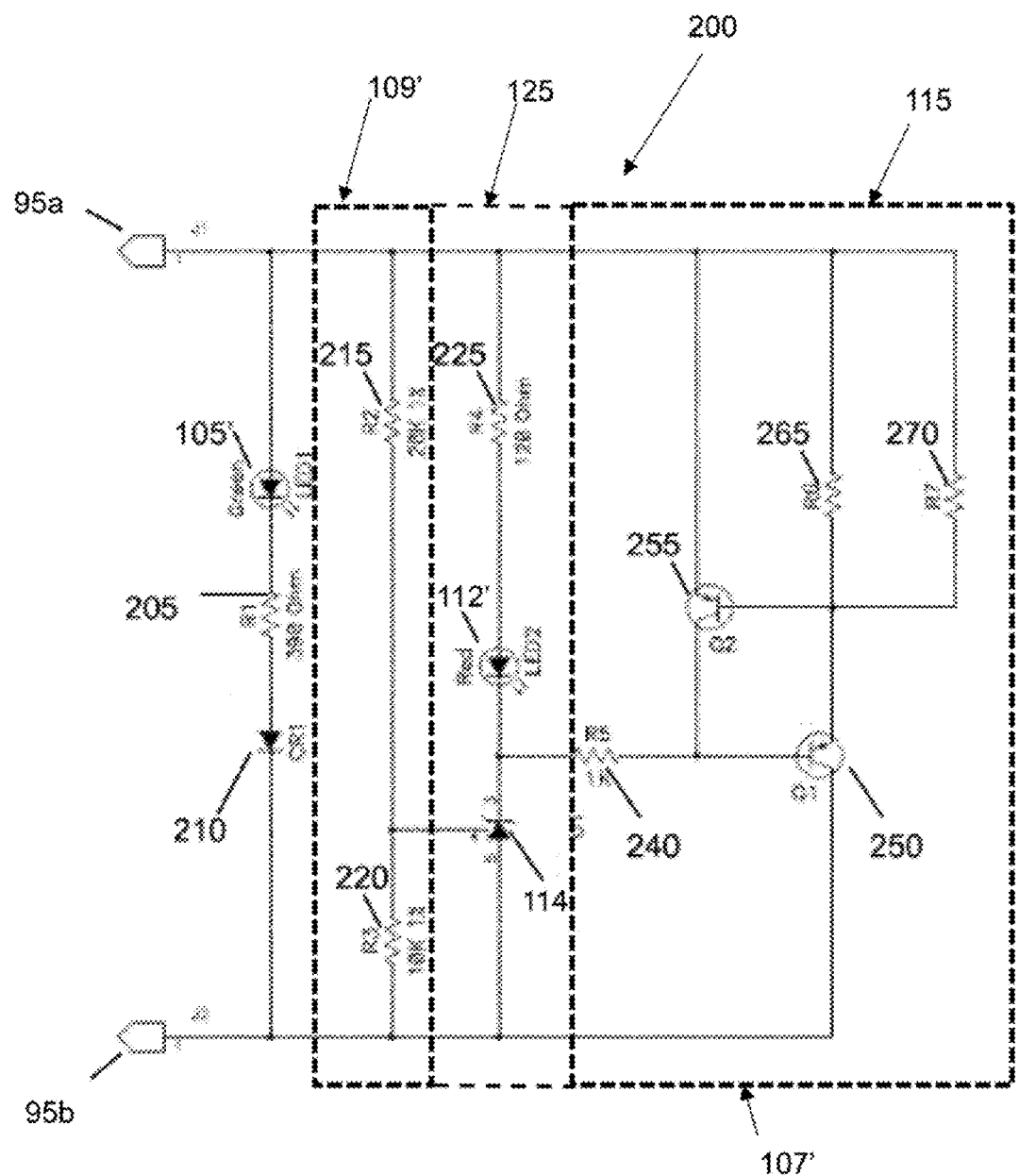
Figure 20:
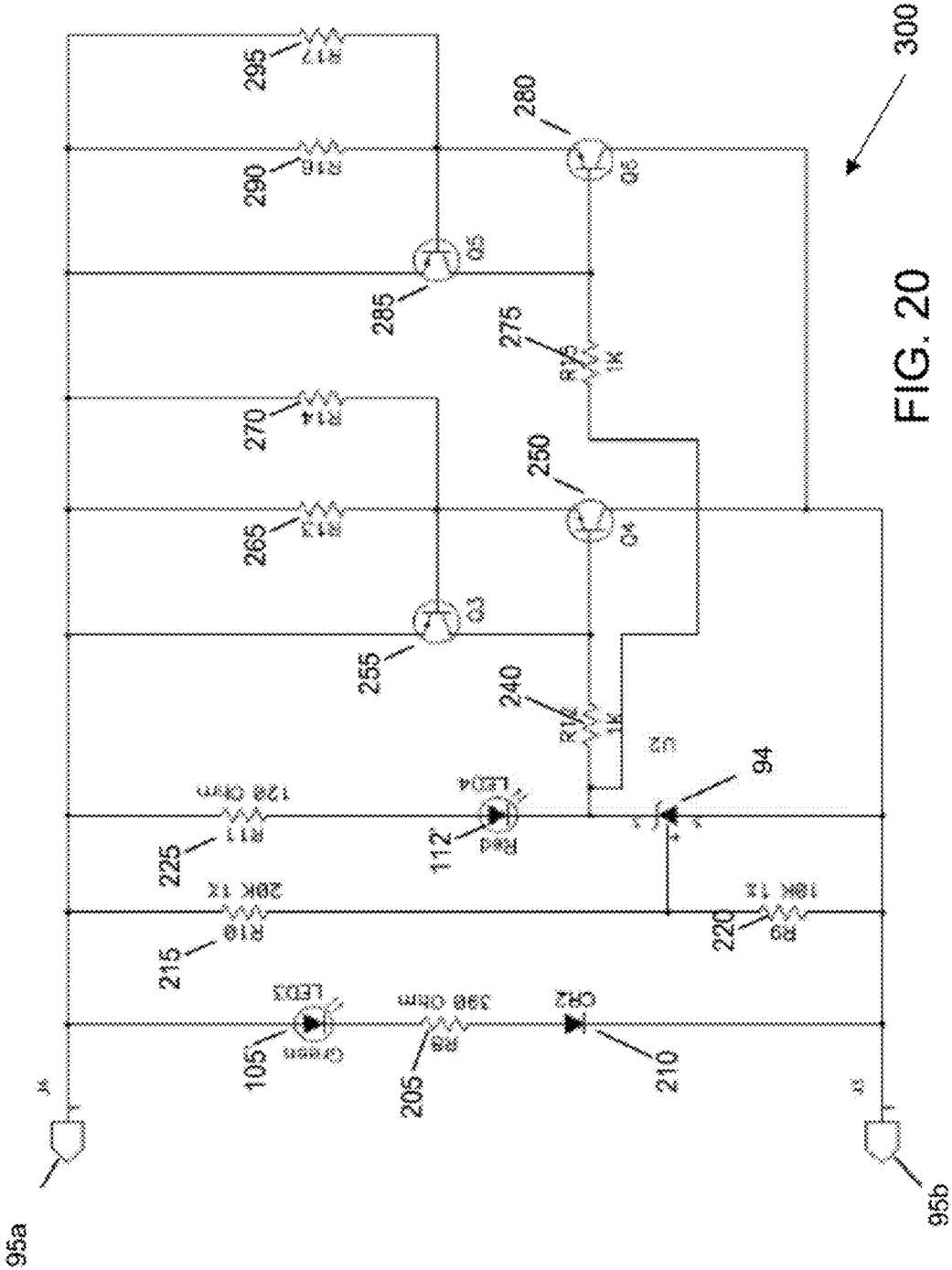

FIGS. 19 and 20 are circuit diagrams of embodiments of battery unit balancing systems.

Figure 21:
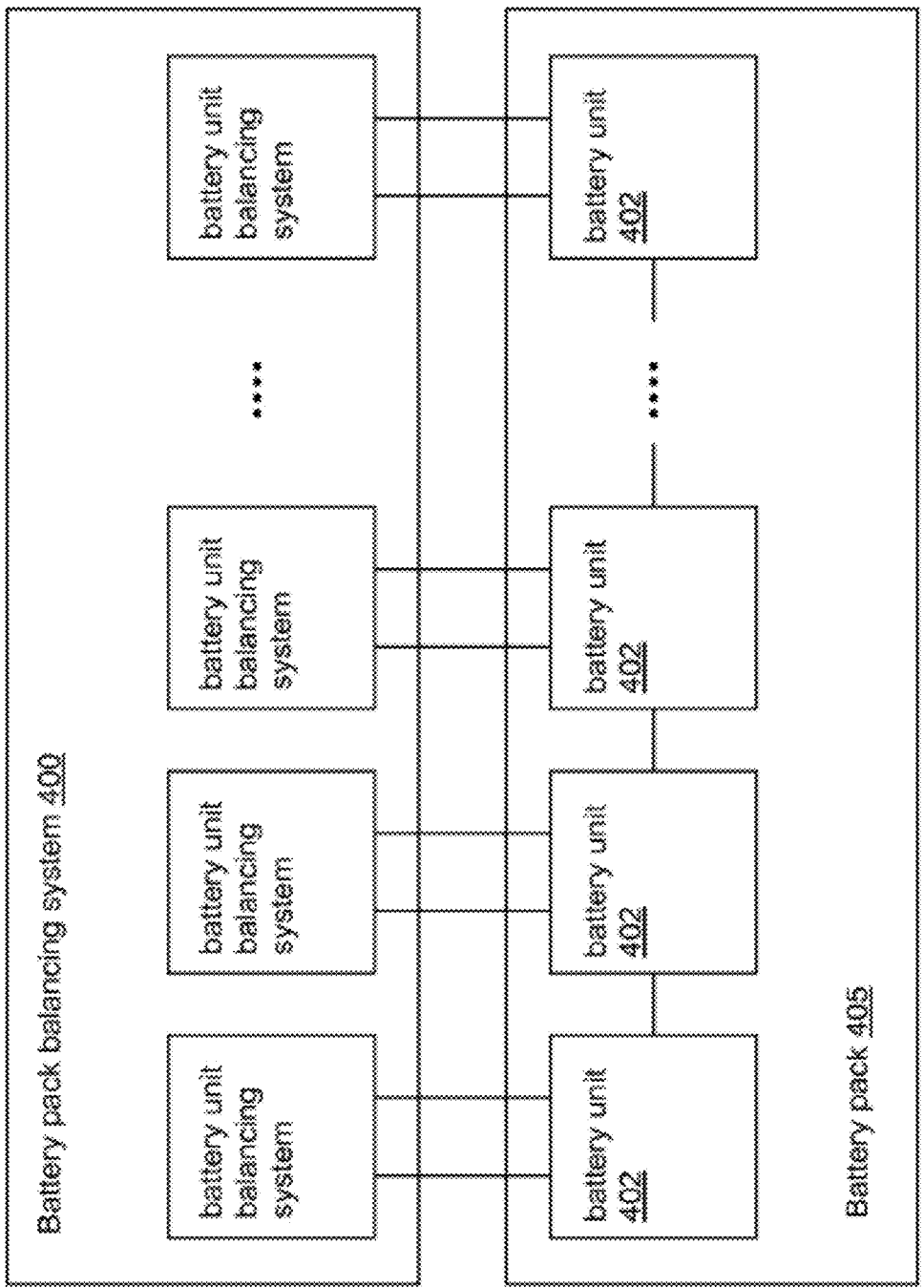

FIG. 21 is a block diagram of an embodiment of a plurality of battery unit balancing systems for balancing a battery pack.

Figure 22:
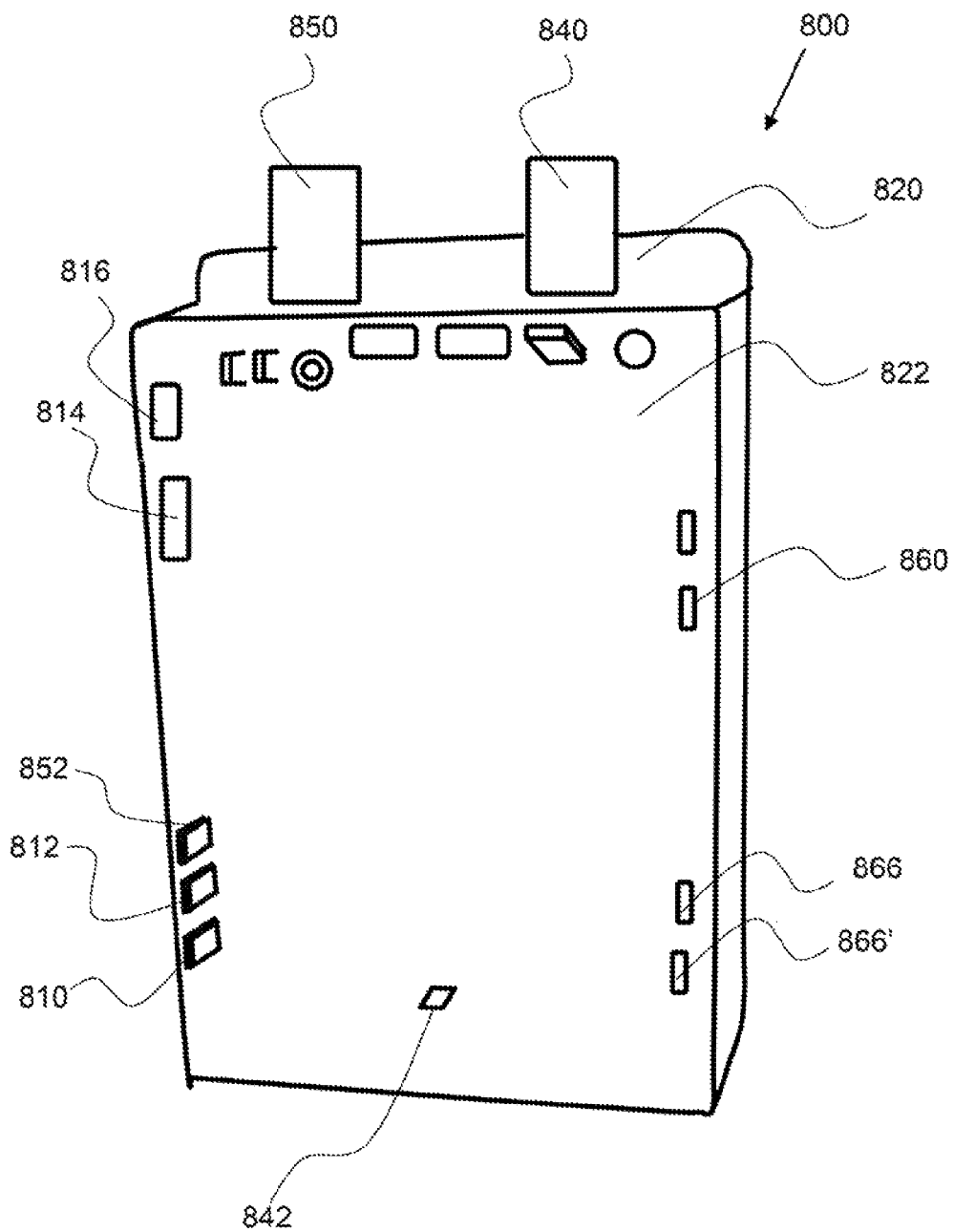

FIG. 22 shows a black and white photograph of an exemplary integrated battery control system configured within an enclosure having a battery power input connection and a power output connection.

Figure 23:
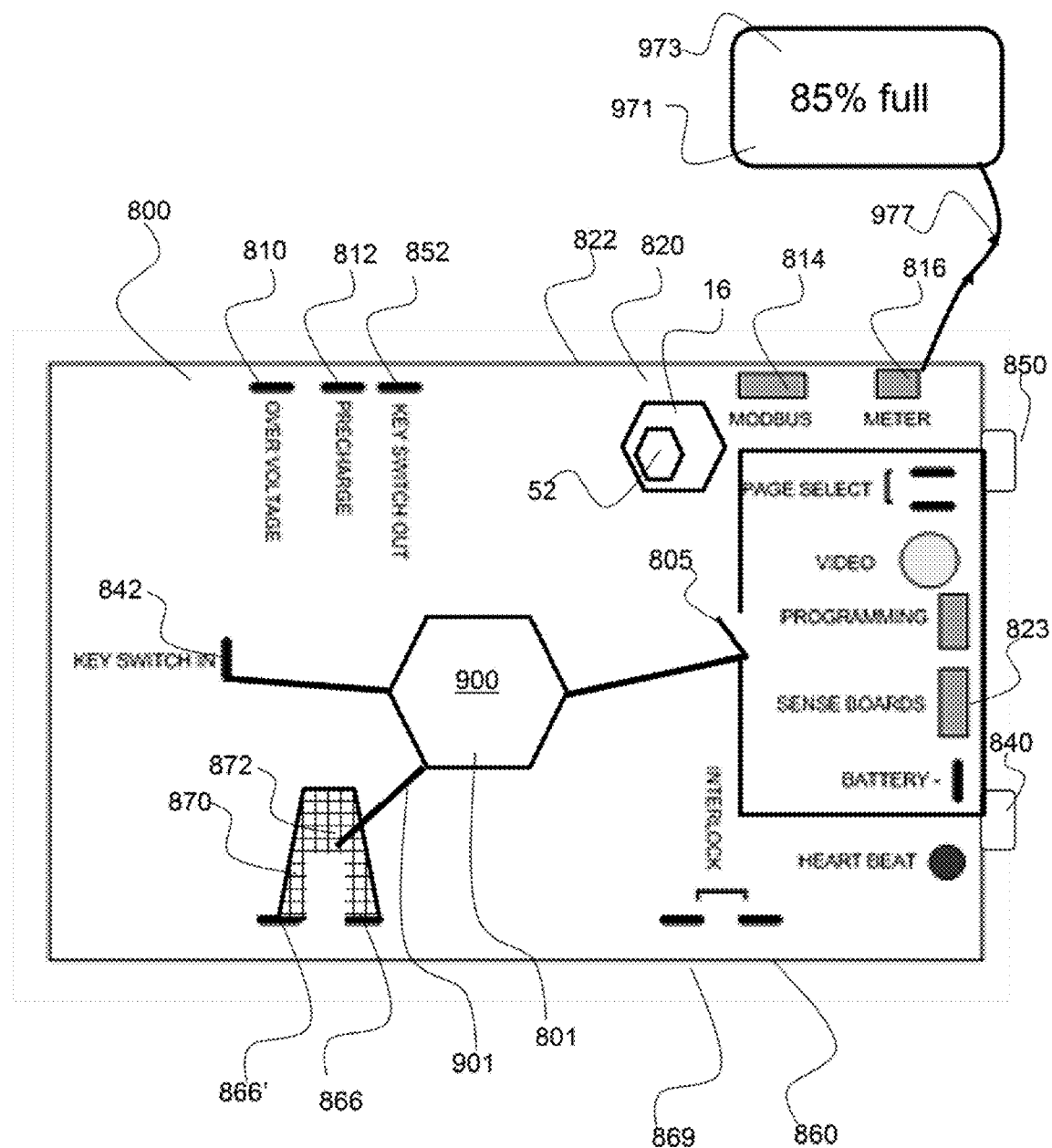

FIG. 23 shows a diagram of an exemplary control enclosure of an integrated battery control system having a plurality of inputs and outputs.

Figure 24:
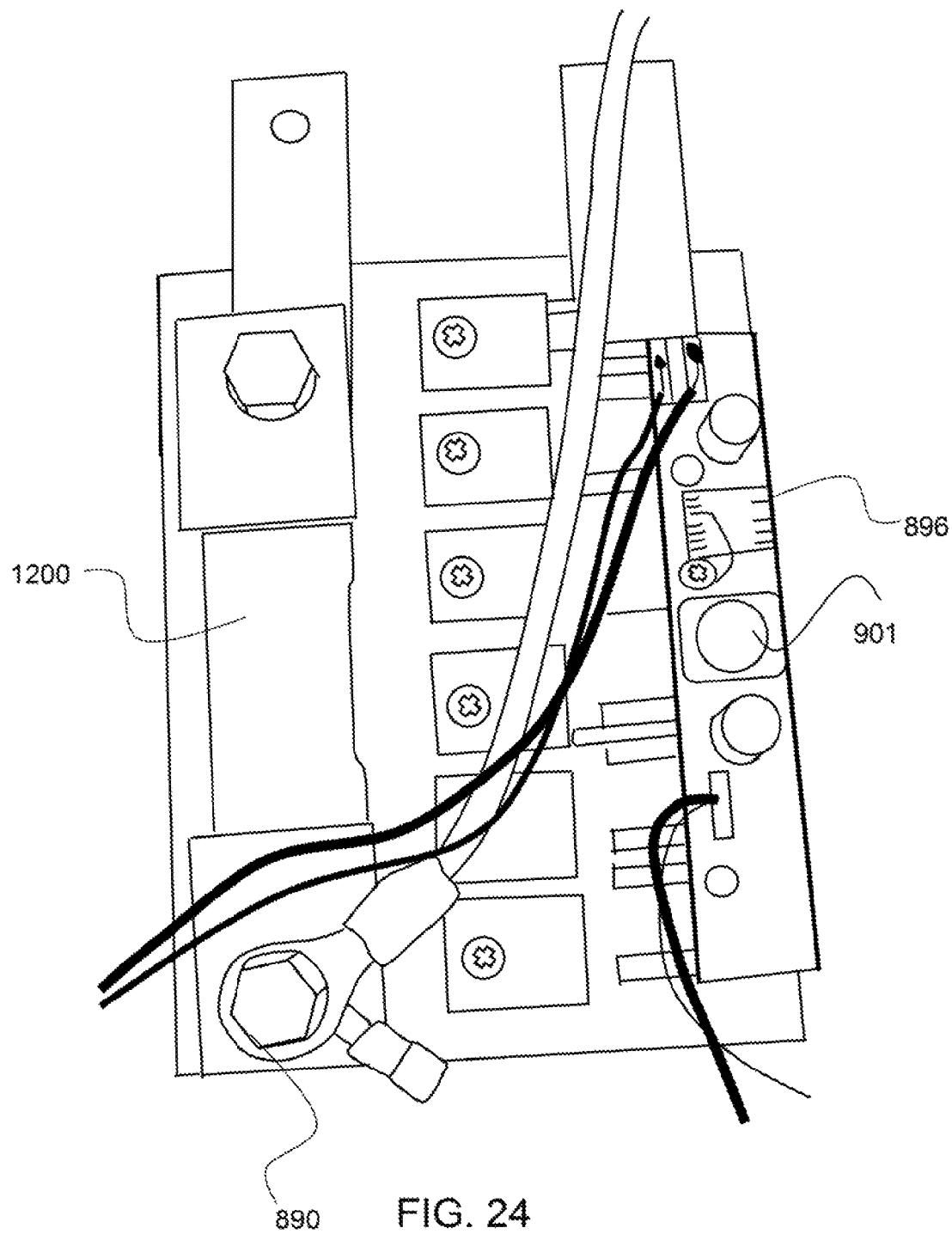

FIG. 24 shows a black and white photograph of exemplary integrated battery control system components including a shunt and control electronics.

Figure 25:
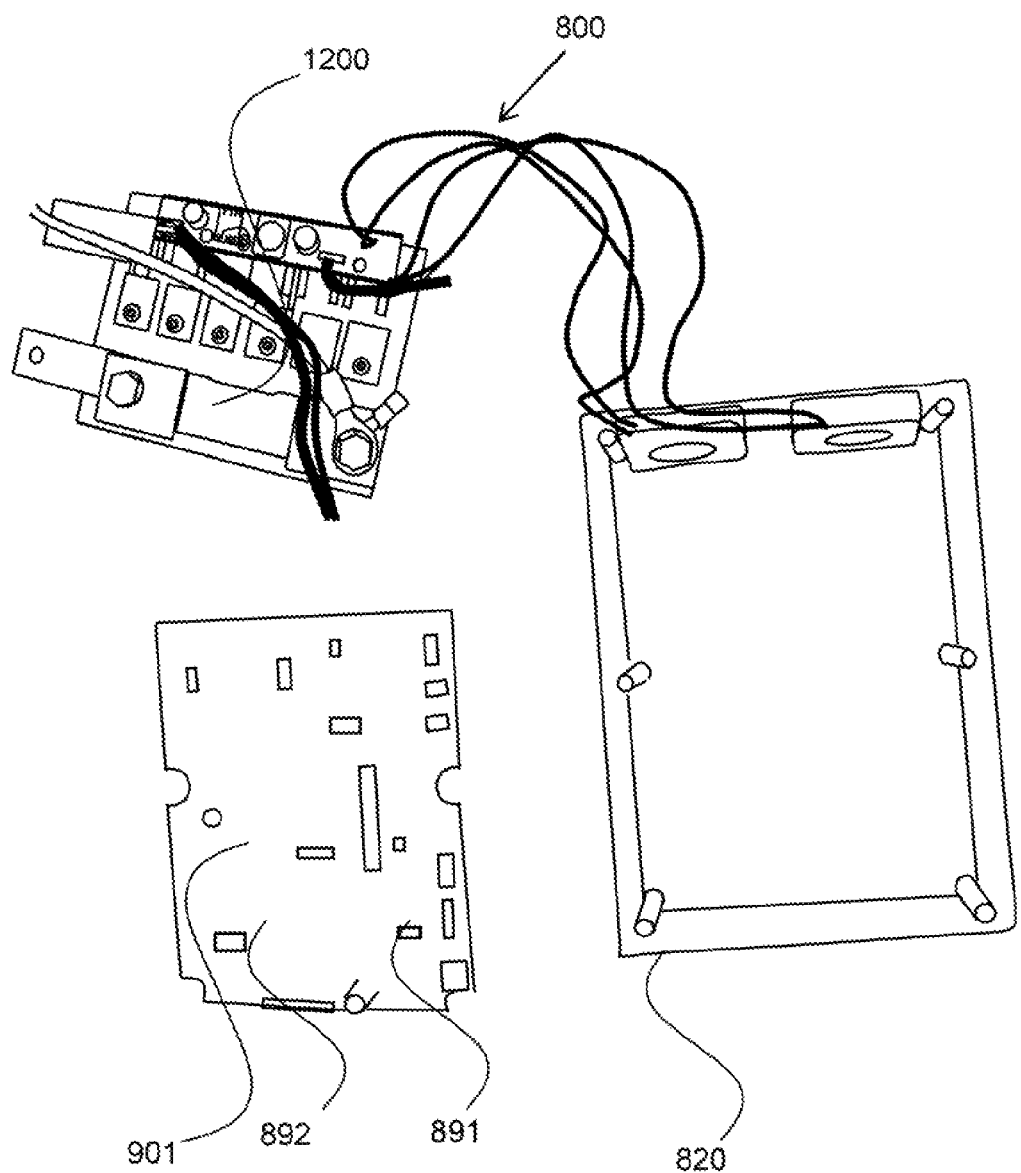

FIG. 25 shows a black and white photograph of exemplary integrated battery control system including a control enclosure and a control board having a microprocessor.

Figure 26:
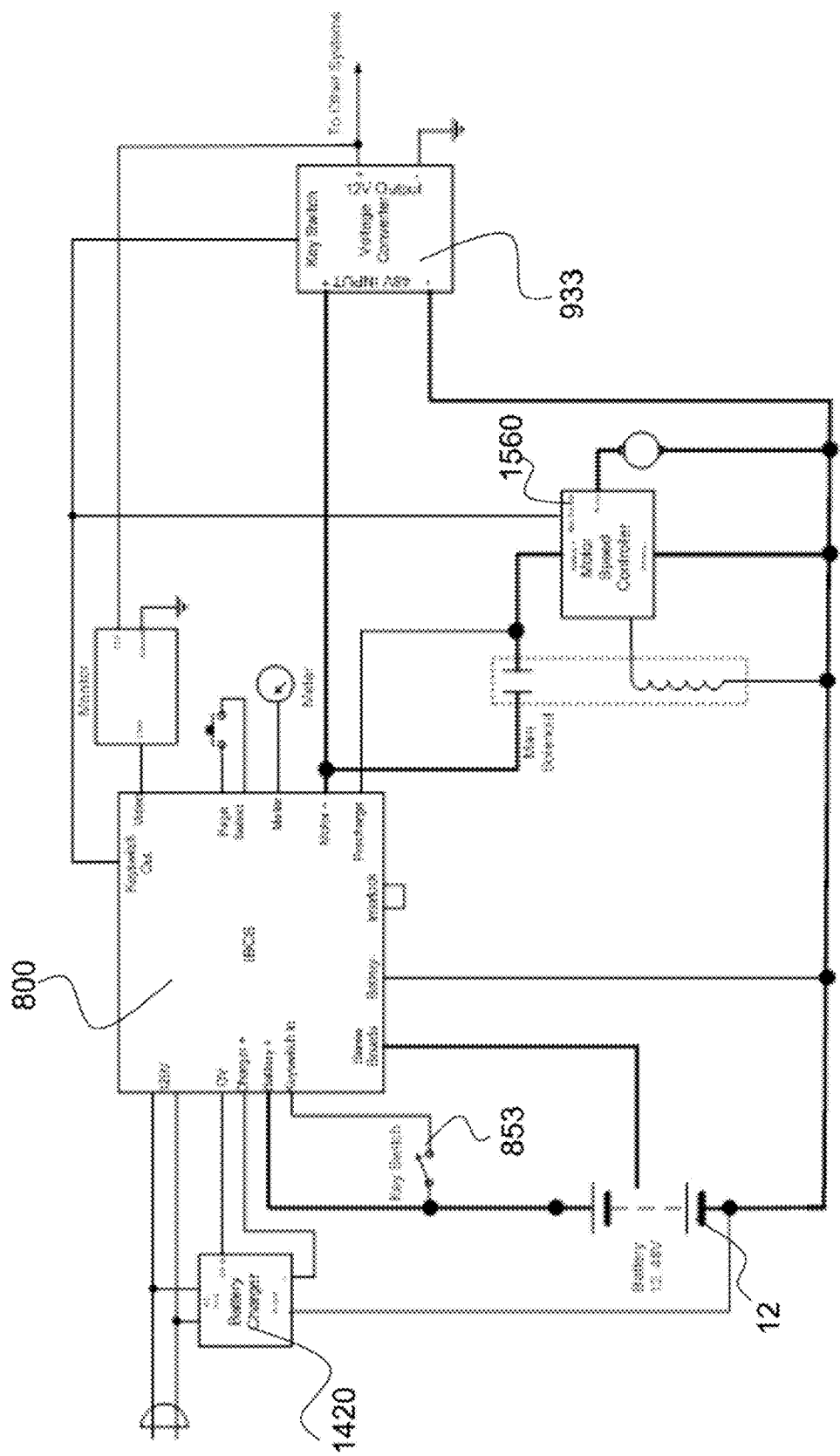

FIG. 26 shows an exemplary schematic of an integrated battery control system for a golf cart.

Figure 27:
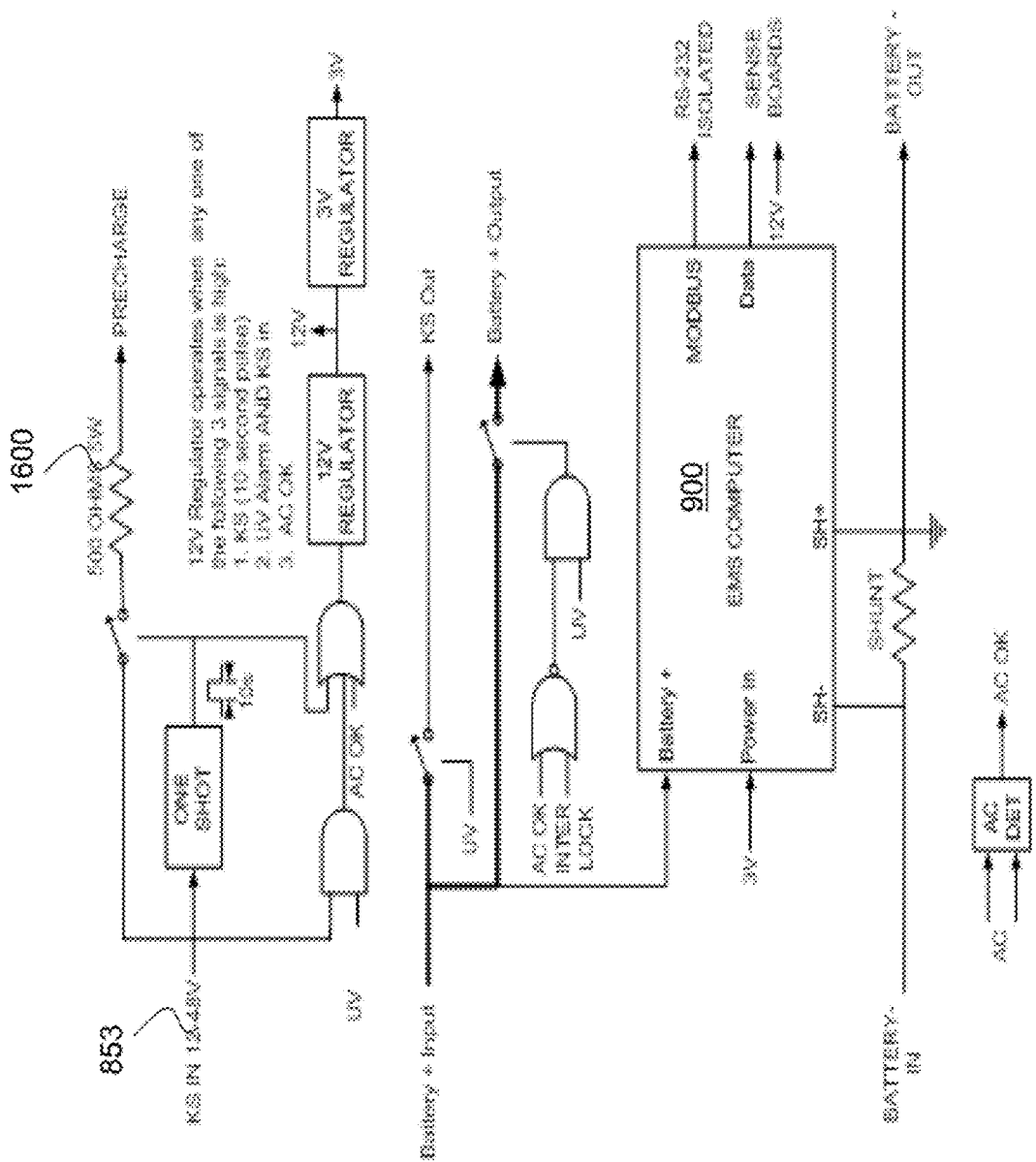

FIG. 27 shows an exemplary block diagram of an exemplary power control system.

Figure 28:
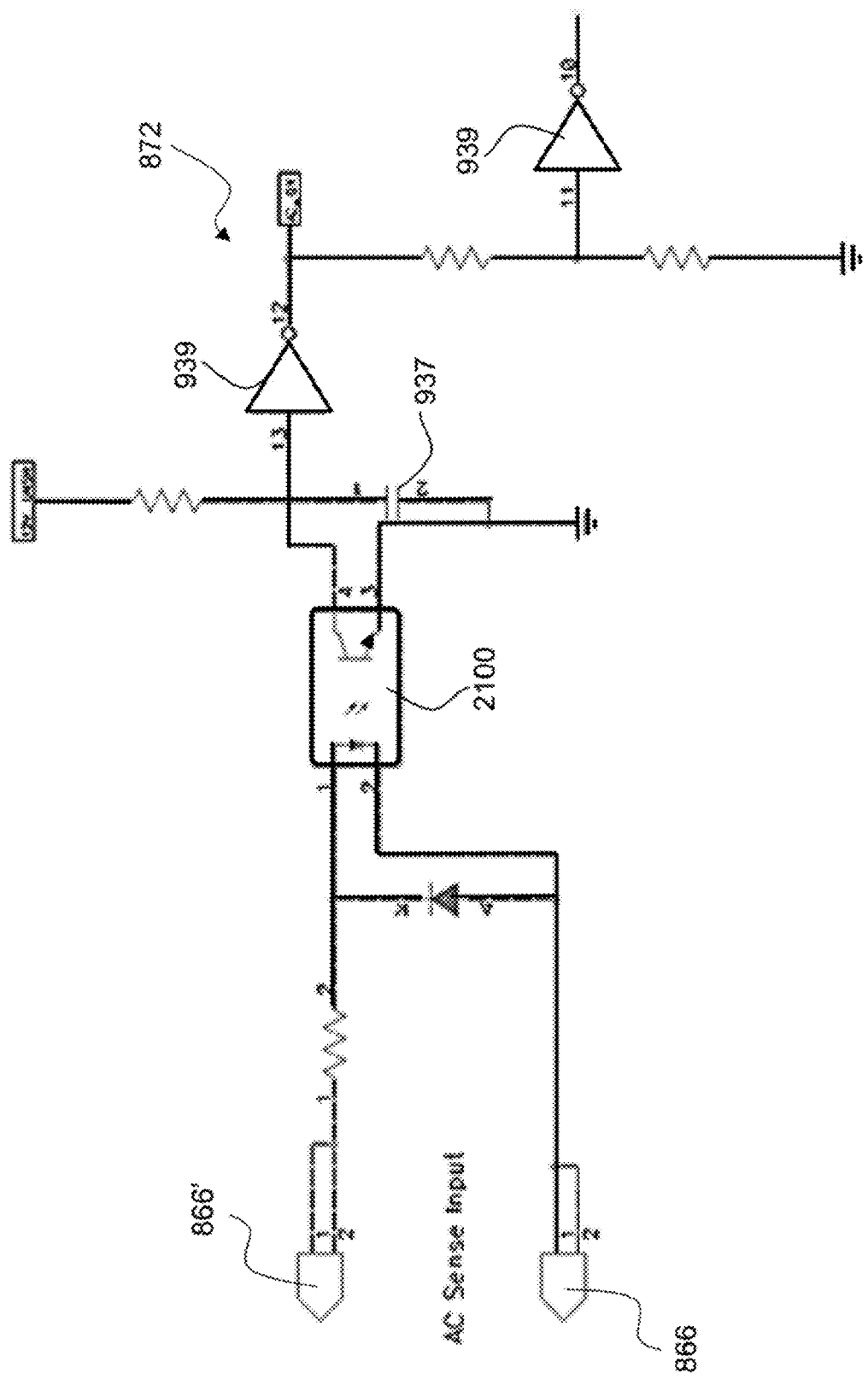

FIG. 28 shows an exemplary charger power sensor circuit.

Figure 29:
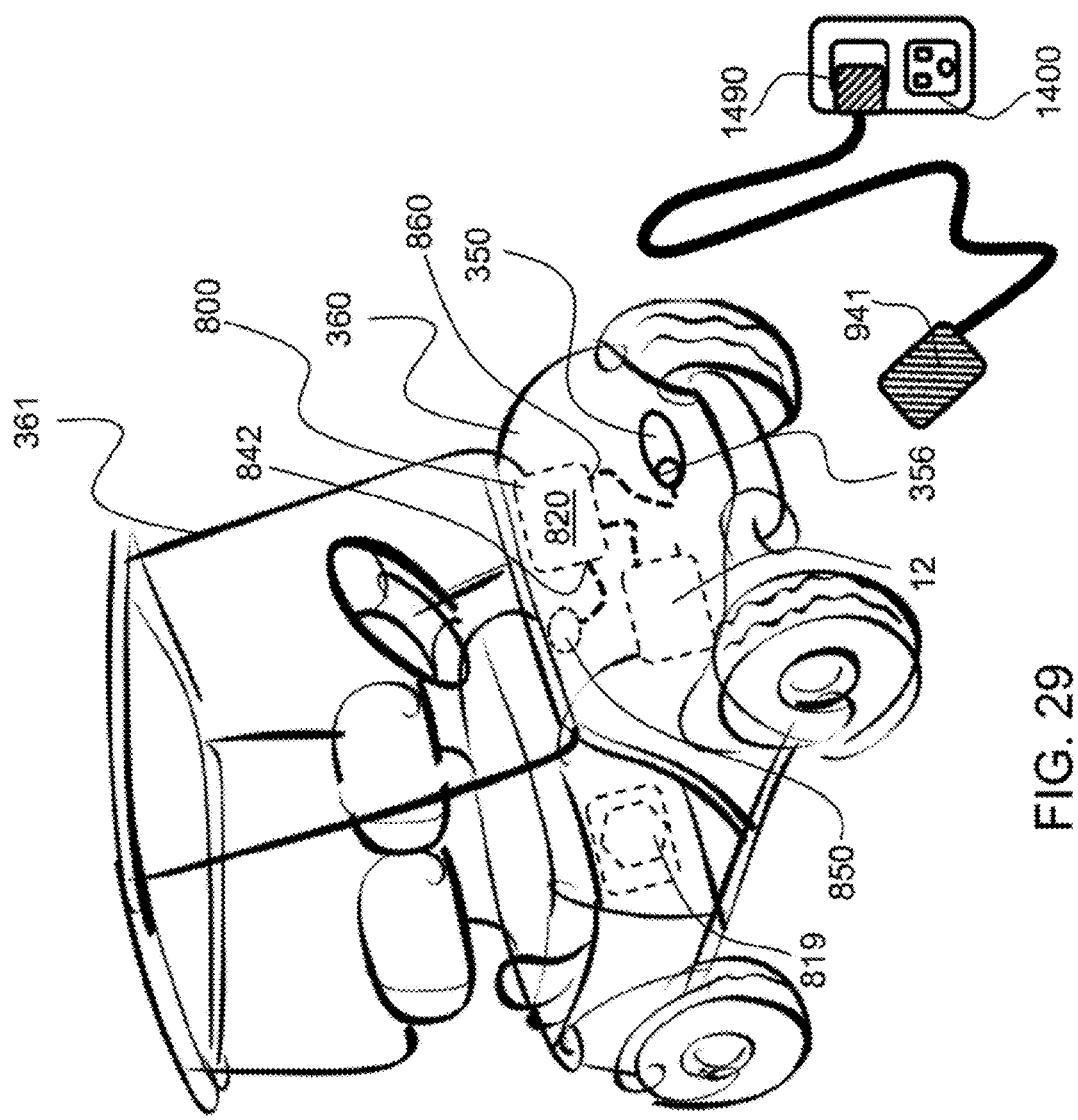

FIG. 29 shows an exemplary integrated battery control system in an electric golf cart.

Corresponding reference characters indicate corresponding parts throughout the several views of the figures. The figures represent an illustration of some of the embodiments of the present invention and are not to be construed as limiting the scope of the invention in any manner. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

Certain exemplary embodiments of the present invention are described herein and illustrated in the accompanying figures. The embodiments described are only for purposes of illustrating the present invention and should not be interpreted as limiting the scope of the invention. Other embodiments of the invention, and certain modifications, combinations and improvements of the described embodiments, will occur to those skilled in the art and all such alternate embodiments, combinations, modifications, improvements are within the scope of the present invention.

As shown in FIG. 1, a lithium battery has a non-linear discharge profile. The discharge rate from approximately 5% to 80% of full charge is substantially linear but has a very small slope. Therefore, it is difficult to estimate the state of charge of a battery, or battery unit by measuring the voltage. Small variations in voltage may result in erroneous estimates of the state of charge. As described herein, a power control system may calculate the time remaining before a battery pack should be shut down when being used as the output power supply. The power control system and specifically the computing device may initiate battery shut down if a calculated value of 80% discharged or more is reached.

As shown in FIG. 2, an exemplary battery pack 12 comprises two battery units 20 and 20', each having four individual lithium batteries 21. The batteries are all connected in series by jumpers 27. A jumper 27' connects the first battery unit 20 with the second battery unit 20'. Battery monitoring modules 30 are configured between the positive 28 and negative 29 terminals of the batteries. A battery monitoring module may comprise a voltage sensor 34 and/or a temperature sensor 36. A circuit 87 on a module 30 may be configured to determine the voltage state of a battery. Module connectors 32 connect battery monitoring modules in a daisy-chain configuration. Module connector 32' couples a battery monitoring module from the first battery unit to a battery monitoring module on the second battery unit. A battery power cable 26 is configured to provide power to the power control system. A battery module data cable 61 is configured to couple with a battery data input, as shown in FIG. 2.

Referring now to FIG. 3, a block diagram of an exemplary embodiment of a battery management system 16 connected to a battery pack 12 is shown and described. The battery management system includes battery unit monitoring modules 30 (e.g., sense boards), a computing device 52, and a display 53 (e.g. a monitor such as an LCD monitor or a monitor incorporated into another device, such as a DVD player). The computing device 52 can measure voltage and/or current for the entire battery pack and output the data to the display 53. In various embodiments, the computing device can determine the state of charge of the battery pack 12 by measuring the amount of current that flows in or out of the battery pack. The battery pack can integrate the amount of current to determine the state of charge. In some embodiments, when the battery pack reaches a minimum, predetermined voltage, the computing device can set the pack's state of charge to about 0%. When the battery pack reaches a maximum, predetermined voltage, the computing device can set the state of charge to about 100%.

In some embodiments, the battery pack 12 may include a plurality of battery units 20 (e.g., battery cells). Each battery unit may include a battery cell or a plurality of battery cells. The battery pack can connect to an external load or powered device 54, such as a motor for an electric vehicle. Each battery unit monitoring modules of the management system can connect to a battery unit. A monitoring module can obtain data, such as voltage and/or temperature, for the battery unit connected to the module. The monitoring modules can transmit the data to the computing device, which can output the data to the display.

In some embodiments, the computing device 52 may be configured to operate with a predetermined, fixed number of battery unit monitoring modules 30. In some embodiments, the computing device may be configured to scan the modules to determine the number of modules present. The computing device can scan the battery unit monitoring modules to determine the number of monitoring modules in the system. For example, in some embodiments, the computing device can output a scan signal to the first monitoring module. In response, the monitoring module can return battery unit voltage and temperature data to the computing device and can output a scan signal to a successive monitoring module. In some embodiments, the monitoring module can also return battery unit voltage and temperature data to the computing device, and can output a scan signal to the next module. Thus, the computing device can count the number of monitoring modules by the number of voltage and temperature data packets received. Further, the computing device can number a monitoring module and/or battery unit based on the module's or unit's position in the order of scan signals received. In some embodiments, a user can configure the computing device to set the number of monitoring modules or to instruct the device to scan the modules and obtain the number of modules itself.

The computing device can detect error conditions for individual battery units and/or the entire battery pack. Exemplary error conditions can include conditions such as high voltage conditions, low voltage conditions, high current conditions, and high temperature condition. Another exemplary error can be a connection fault condition, e.g., a connection between at least one battery unit and a contact point with a zero-voltage reference level, such as a chassis of an electric vehicle.

When an error is detected, the computing device can initiate a measure based on the error condition. For example, if the computing device detects a high voltage condition for the entire battery pack, the computing device can inactivate a device that charges the pack (not shown). In another example, if the computing device detects a first low voltage condition, the computing device 52 can output a low voltage warning to the display. If the battery pack's voltage drops further, triggering a second low voltage condition, the device can inactivate a load connected to the battery pack, such as a motor controller of an electric vehicle.

Referring now to FIG. 4, a block diagram of an exemplary arrangement of battery unit monitoring modules 30 and battery units 20 in a pack 12 is shown and described. In this embodiment, the monitoring modules are connected to the battery units, which are connected in series. Each monitoring module can be connected to a single battery unit. The battery unit can supply the connected monitoring module with power for performing its operations.

FIG. 5 is a block diagram depicting connections within the battery management system 16 between the computing device 52 and the battery unit monitoring modules 30. The computing device includes an output data request port (also referred to herein as an "enable output") and an input data port. Each monitoring module includes an output data port, an input data request port (also referred to herein as an "enable input"), and an output data request port. Each monitoring module's output data port is connected in parallel to the computing device's input data port.

The computing device's output data request port is connected to the first one of the battery unit monitoring module's 30a input data request port. The monitoring module's 30a output data request port is connected to the input data request port of the successive monitoring module 30b. In turn, the monitoring module's 30b output data request is connected to the input data request port of the next monitoring module 30c. The remaining monitoring modules are connected in the same manner. The communications of the computing device 52 and battery unit monitoring modules described herein are transmitted from and received at these ports, as would be understood by one of ordinary skill in the art. Further, in various embodiments, the computing device and monitoring modules include voltage and ground connections such that the computing device can provide power (e.g., 12V) and ground to the monitoring modules.

In operation, to obtain data about the battery units 20, the computing device sends a data request signal (also referred to herein as an "enable signal" or an "enable pulse") to the first battery unit monitoring module 30a. In response, the monitoring module 30a transmits data about a connected battery unit 20a to the computing device. After the module 30a finishes transmitting data, the module 30a sends a data request signal to the second battery unit monitoring module 30b. In response, the monitoring module 30b transmits data about a connected battery unit 20b to the computing device. After the module 30b finishes transmitting data, the module 30b sends a data request signal to the third battery unit monitoring module 30c, and the process continues for the rest of the monitoring modules.

Using this communication system, the computing device can match data with a battery unit according to the order in which the device receives data. Thus, the first set of data can be matched to the first battery unit 20a, the second set of data to the second unit 20b, and so forth. In this manner, the computing device uses few ports for obtaining data and matching the data to battery units. In some embodiments, such a battery management system may eliminate the needs for dedicated addressing ports, addressing switches, and/or jumpers.

When the computing device does not receive data from a battery unit 195 for at least a predetermined period of time (e.g., 20 ms, although other times may be used), the computing device can conclude that data collection for the battery unit 20 has been completed. The computing device can obtain another set of data by transmitting another data request to the first battery unit monitoring module 30a, thereby restarting the data collection process. In some embodiments, the computing device can collect data about the battery units as often as needed or programmed, e.g., several times per second.

In some embodiments, the computing device can first compare the number of data received with the number of monitoring modules. If the numbers match, the computing device can determine all the monitoring modules are operational and continue obtaining data about the battery units. If the numbers do not match, the computing device can conclude that at least one monitoring module and/or battery unit is not operational. The computing device can generate and output an error message to the display. Since the modules transmit data to the computing device in sequential order, the computing device can identify the non-operational module or unit according to the number of data received. In this manner, the computing device can inform a user of physical locations of faults in the monitoring modules or battery pack, allowing the user to troubleshoot problems.

Regarding the individual monitoring modules, in some embodiments, a module can measure data for a connected battery unit upon receiving a data request signal. In some embodiments, a module can measure and store data in a buffer. Then, when the module receives the data request signal, the module may access the buffer and may transfer the data stored therein to the computing device.

The monitoring module can transmit the data to the computing device in a human readable form. The monitoring modules can transmit the data via an asynchronous serial protocol, such as protocols used for RS-232 or USB connections. The monitoring modules can transmit the data at any rate and with any number of start and/or stop bits. For example, a module can transmit at 9600 Baud with 1 start bit and 1 stop bit.

Referring now to FIG. 6, a diagram depicting connections between battery unit monitoring modules 30 is shown and described. In some embodiments, wiring 400 (e.g., ribbon cable, 4-wire round shape harnesses) can be used to connect the monitoring modules to one another. In some embodiments, for each monitoring module, the output data port can be located in the center of a module's interface. In some embodiments, the input data request port and the output data request port can be symmetrically located on opposite sides of the output data port. By orienting each battery unit monitoring module in an opposite direction from adjacent modules 30, wiring 400 can connect the output data request port of one module to the input data request port of the successive module. Due to the orientation of the ports, the wiring 400 need not be twisted or folded. Further, the wiring 400 can connect all the output data ports to the input data port of the computing device 52. When a monitoring module transmits data for its connected battery unit 20, the data can be sent across each portion of wiring 400 connecting the monitoring modules 30 before the data arrives at the computing device.

FIG. 7 is a hybrid block and circuit diagram depicting an exemplary battery unit monitoring module 30. The monitoring module includes terminals 502 and 503, a microprocessor 505, a reverse connection protection system 510, a battery unit balancing system 515, a voltage regulator 520, resistors 525, 526 for sampling a battery unit's voltage, and a temperature monitoring device 527 (e.g., a thermistor) for sampling a battery unit's temperature. The monitoring module 30 also includes a receiver 540 for receiving a data request signal from a computing device 110 comprising a microprocessor 505, a driver 541 for transmitting data of the connected battery unit to the computing device 110, and a driver 542 for transmitting a data request signal to another monitoring module.

A battery unit 20 connects to the monitoring module 30 at terminals 502 and 503. Thus, the battery unit applies its voltage to the reverse connection protection system 510. If the voltage is sufficiently high, the protection system 510 conducts and applies the voltage to the voltage regulator 520, resistors 525, 526, temperature monitoring device 527, and balancer 515. If the battery unit is improperly connected to the terminals 502, 503 (e.g., with incorrect polarity), the reverse connection protection system 510 does not conduct, thereby protecting the module from potentially damaging voltages.

When the protection system 510 conducts, the voltage regulator 520 can draw upon the battery unit's voltage to supply a stable voltage (e.g., 2V) for the monitoring module. In particular, this voltage can power the microprocessor 505. The microprocessor 505 can obtain the battery unit's voltage via resistors 525 and 526 and/or the temperature via temperature monitoring device 527. In some embodiments, the microprocessor 505 can sample the values on the resistors 525, 526 and temperature monitoring device 527 to obtain the voltage and temperature. The microprocessor 505 can store the values in an internal memory.

In some embodiments, when the receiver 540 receives a data request signal, the receiver 540 transmits the signal to the microprocessor 505. In response, the microprocessor 505 obtains the voltage and temperature of the battery unit, either by measuring the values on the resistors 525, 526 and temperature monitoring device 527 or by accessing stored values in an internal memory. The microprocessor 505 transmits the values to the driver 541, which drives the values back to the computing device via, for example, asynchronous serial ASCII communication. At substantially the same time, the microprocessor 505 can generate and output a data request signal to the driver 542. The driver 542 drives the data request signal to the next monitoring module for obtaining data about its connected battery unit.

Referring now to FIG. 8, a circuit diagram of an exemplary embodiment of a battery unit monitoring module is shown and described. In this embodiment, the terminals 602, 603 correspond to the terminals 502, 503 of FIG. 12. The protection system 606 can be a metal-oxide-semiconductor field effect transistor (MOSFET) 605, such as a p-type MOSFET. Terminals of the battery unit can connect to both the source and base of the MOSFET 605. When the battery unit's voltage is sufficiently high, the voltage activates the MOSFET 605. As the MOSFET 605 conducts, the battery unit applies its voltage to the voltage regulator 610. If the battery unit's voltage is insufficiently high, or its polarity is reversed, the MOSFET 605 does not conduct, thereby protecting the module from potentially damaging voltages. In this manner, the MOSFET 605 can operate as a low voltage drop diode 606.

The voltage regulator 610 can be an integrated circuit (e.g., a LP2951) which can use a transistor 611, an operational amplifier 612, and two resistors 614, 615 to regulate a voltage. Resistors 616, 617 can divide the output of the voltage regulator 610 to, for example, 2V. The divided voltage can be fed back to the error amplifier 612, and the regulator 610 can adjust the output accordingly. In this manner, the voltage regulator 610 can output a substantially constant voltage. The capacitor 618 can filter the divided voltage before supplying the voltage to a microprocessor 620. Further, a power supply can power a clock generator (with capacitors 623, 624, ceramic resonator 625, resistor 626, and buffers 627, 628) to generate a clock signal. The clock signal can be provided to the microprocessor 620 for its operations.

The battery unit can connect, via the terminals 602, 603, to resistors 629, 630. A thermistor 631 may be connected to the output of the voltage regulator 610. A node between the resistors 629, 630 and a node adjacent to the thermistor 631 can connect to input ports of the microprocessor 620, which in turn can connect to an internal analog-to-digital converter (also referred to herein as A/D converter). One of the inputs to the internal A/D converter can sample the voltage between the resistors 629, 630 to determine the voltage of the battery unit. Another input to the internal A/D converter can sample the temperature of the battery unit 195, expressed as a voltage, via the thermistor 631. The microprocessor 620 can store the voltage and temperature in an internal memory. In some embodiments, the microprocessor 620 connects to separate A/D converters that sample the voltage and temperature.

The microprocessor 620 can receive a data request signal via the receiver 640 (e.g., an optocoupler). In response, the microprocessor 620 can obtain the voltage and temperature of the battery unit and transmit the values to the driver 641, which drives the values back to the computing device. At substantially the same time, the microprocessor 620 can generate and output a data request signal. The data request signal can connect to the base of a transistor 650. When the signal turns on the transistor, a current flows through the driver 642 to output another data request signal to the next monitoring module.

FIG. 9 is a circuit diagram of an exemplary embodiment of an interface 700 for the computing device. The interface 700 can be used by the computing device for communicating with to battery unit monitoring modules. The computing device can apply a data request signal to the gate of a transistor 705, such as a metal-oxide-semiconductor field-effect transistor (MOSFET). In response, the transistor 705 conducts and current flows from the voltage source 710 through the resistors 715, 716. The voltage that develops at the node between the resistors 715, 716 activates the transistor 720. As a result, current flows from the voltage source 710 through the transistor 720 and resistor 721 to output a data request signal (e.g., a logic high signal) for the first battery unit monitoring module.

The circuit can receive a data signal (e.g., as 12V signal) through the TX pins on a connector. Resistors 725, 726 can divide the data signal, and the Zener diode 730 can clamp the data signal to a voltage substantially equal to the voltage supplied to the battery unit monitoring module's microprocessor (e.g., 3.3V). An inverter 735, such as a Schmitt Trigger inverter, can eliminate noise and sharpen the rise and fall times of the divided and/or clamped data signal before passing the data signal to the microprocessor of the computing device.

In various embodiments, the interface 700 can be located on the same board as the other components of the computing device. In some embodiments, the communication interface can be isolated from those other components.

FIG. 10 is a block diagram depicting an exemplary embodiment of the computing device of the battery management system. The computing device can include a central processing unit (CPU. e.g. 8-core processor) 905 and a memory 910 (e.g., electrically erasable programmable read-only memory, or EEPROM serial memory) that stores a program with executable instructions. The program can be loaded into the memory 910 from an external device connected via, for example, the bus interface 965 or a USB cable. The CPU 905 can load and execute instructions from the memory 910 to perform its operations. The program may include configuration data, such as the predetermined number of battery unit monitoring modules in the system or the threshold battery unit voltage or temperature that would trigger an error condition. In some embodiments, the program may obtain the configuration data from values input by a user of the system 100.

The computing device can use an analog-to-digital (A/D) converter 915 to measure the voltage of a battery pack. The A/D converter 915 can sample the voltage to obtain a value. The computing device can use an analog-to-digital (A/D) converter 916 to measure the current of the battery pack. In some embodiments, the A/D converter 916 is connected to a shunt, which in turn is connected to a terminal of the battery pack and a terminal of the external load 198. The shunt can be a resistor that develops a voltage drop proportional to the battery pack's current (e.g., 0.0001 Ohms developing a voltage drop of 0.1 mV/A). An amplifier 917 can amplify the value of the current before the A/D converter 916 samples the current. The A/D converters 915, 916 can direct the battery pack voltage and current to an isolation barrier 920 controlled by a signal from a connection fault detector 925. In some embodiments, the A/D converters 915, 916 are on the same board as the CPU 905, isolated, and/or both.

The connection fault detector 925 can signal the presence of a connection between a battery unit and a zero-voltage reference level. For example, the zero-voltage reference level can be the battery pack's enclosure or chassis, and the connection between a battery unit and the chassis would represent a hazard to service personnel. When one or more battery units 195 within the battery pack contacts a point at the zero-voltage reference level, the contact can cause current to flow from the battery unit. The connection fault detector 925 detects the connection and outputs a signal to the CPU 905 which will display a warning indicating this connection on the display device.

The CPU 905 can connect to the battery unit monitoring modules to obtain data about the individual battery units, as described in reference to FIGS. 5-7. The CPU 905 can process data about the individual battery units 195 and/or battery pack 190 to create a composite video signal. A digital-to-analog (D/A) converter 930 (e.g., a 3-bit converter) can produce the composite video signal from digital to analog format so the signal can be displayed on a display.

If the CPU 905 detects an error condition, the CPU 905 can transmit an error signal to an alarm output system 940. The system 940 can be used to control a component and/or device that responds to the error signal (e.g., a charger that stops charging the battery pack 190, or a motor controller of an electric vehicle that stops discharging the battery).

The computing device can include power supplies 960 (not shown on FIG. 10). The power supplies 960 supply voltages to components of the battery management system 100. In some embodiments, a power supply 960 can include an internal voltage regulator to provide a constant voltage. The power supplies 960 can be isolated from the other components of the computing device to prevent damage to the device.

The computing device can include an interface 965, such as a controller area network (CAN) interface. The interface can include ports, such as parallel port pins. The computing device can connect to external devices via an interface (not shown). For example, the device can connect to another computing device to receive a program to be stored in the memory 910.

The computing device can include a port 970 for receiving a page select signal. A page can correspond to a format for displaying data about a battery unit 195 within the battery pack 190. For example, one page can display the data for the entire pack 190. Another page can display the voltages and temperatures of eight, twenty, or any other number of battery units 195. Successive pages can display the same information for adjacent sets of battery units 195. The computing device can receive the page select signal from a switch mounted in a dashboard in an electric vehicle, for example (not shown). In response, the computing device can output the selected page containing battery pack data to a display.

FIG. 11 is a block diagram depicting an exemplary embodiment of the alarm output system 940 of the computing device. The alarm output system 940 receives an error signal from the computing device. The alarm output system 940 outputs a binary signal according to the error signal. If the error signal corresponds to an off signal, the system 940 allows current to flow to a ground reference, thereby outputting a logic low signal (e.g., 0V). If the error signal corresponds to an on signal, the system 940 allows current to flow from a voltage source, such as 12V. In some embodiments, the system 940 does not allow current to flow until the error signal lasts at least 30 seconds. In this manner, the system 940 turns on or off external devices according to the persistent presence of an error.

FIG. 12 is a circuit diagram depicting an exemplary embodiment of the alarm output system 940 of the computing device. The alarm output system 940 includes a voltage source 1101, two resistors 1103, 1104, four transistors (e.g., metal-oxide-semiconductor field-effect transistors or MOS-FETs) 1105, 1106, 1107, 1108 configured to form an H bridge, and two transistors 1120, 1121 that operate the alarm output system 940. Transistors 1105, 1108 can be of opposite polarity from transistors 1106, 1107. The alarm output system 940 can apply one or more received error signals to the transistors 1120, 1121 and output one or more command signals corresponding to the error signals at terminals 1130, 1131.

In operation, an error signal can be applied to transistor 1120 and/or transistor 1121. If the computing device detects a low voltage condition, it can apply an error signal to transistor 120. As transistor 1120 conducts, the voltage applied to the gates of transistors 1107, 1108 by the voltage source 1101 drops. The voltage differential between the source and gate of transistor 1107 decreases to turn the transistor 1107 off. The voltage differential between the source and gate of transistor 1108 increases to turn the transistor 1108 on. As transistor 1108 conducts, current flows from the voltage source 1101 through the transistor 1108 to the output terminal 1130. The voltage that develops on the output terminal 1130 can be used to shut off a motor controller, by way of example.

If the computing device detects a high voltage condition, a high current condition, or a high temperature condition, the device can apply an error signal to transistor 1121. As transistor 1121 conducts, the voltage applied to the gates of transistors 1105, 1106 by the voltage source 1101 drops. The voltage differential between the source and gate of transistor 1106 decreases to turn the transistor 1107 off. The voltage differential between the source and gate of transistor 1108 increases to turn the transistor 1105 on. As transistor 1105 conducts, current flows from the voltage source 1101 through the transistor 1105 to the output terminal 1131. The voltage that develops on the output terminal 1130 can be used to shut off a battery charger or turn on a fan, by way of example.

FIG. 13 is a circuit diagram depicting an exemplary embodiment of the connection fault detection system of the computing device. The connection fault detection system includes an optocoupler 1205 with a light emitting diode 1210 and a transistor 1215, such as a phototransistor. One terminal of the light emitting diode 1210 connects to ground (also referred to herein as "a node at a ground zero reference level"), such as a chassis of an electric vehicle. The other terminal of the light emitting diode 1210 connects to a current sink 1220. One terminal of the transistor 1215 connects to a voltage source 1225. The other terminal connects to a node corresponding to the output 1228 of the optocoupler 1205 (also referred to herein as the "output node"). This node connects to a resistor 1230 that also connects to a ground zero reference level, which can be electrically isolated from the battery pack 190. The current sink 1220 connects to the negative terminal of a voltage source 1235. The positive terminal of the voltage source 1235 connects to the negative terminal of at least one battery unit 195 of the battery pack 190.

In operation, when none of the terminals of the battery units 195 connect to ground, current does not flow through the light emitting diode 1210 of the optocoupler 1205. The light emitting diode 1210 does not activate the transistor 1215, and the transistor 1215 does not conduct. Because the node 1228 corresponding to the optocoupler's 1205 output is disconnected from the voltage source 1225, any charge at the node drains through the resistor 1230 to ground. In this manner, the optocoupler 1205 outputs a logic low signal, such as 0V, indicating that a connection fault has not been detected.

When a positive terminal of a battery unit 195 does connect to a zero-voltage reference level, current flows through the light emitting diode 1210 to the current sink 1220. The current activates the transistor 1215 so the transistor 1215 conducts. Current flows from the voltage source 1225, building charge at the output node 1228. Thus, the optocoupler 1205 outputs a logic high signal indicating that a connection fault has been detected. The logic high signal can be applied to CPU 905, which can output a message to the display device warning an operator of the battery unit management system of a potentially hazardous connection fault.

The voltage sources 1225, 1235 can have any voltage. For example, voltage source 1225 can provide 3.3V. Voltage source 1235 can provide 5.0V. The current sink 1220 can limit the current flowing through itself and the light emitting diode 1210 to any current, such as a minimum safe level of current. For example, the current sink 1220 can limit the current to 2 mA. The current sink 1220 can operate over a range of voltages of the battery pack 190, such as the voltages between the battery pack's 190 positive and negative terminals. In some embodiments, this range can be from about 5V to about 500V. In some embodiments, the current sink 1220 can operate at voltages that exceed the voltage at the positive terminal of the battery pack 190.

FIG. 14 is another circuit diagram depicting an exemplary embodiment of the connection fault detection system of the computing device. This embodiment includes all the components described in reference to FIG. 13. In addition, in this embodiment, the current sink 1220 includes a voltage source 1305, a first resistor 1310, a first transistor 1315, a second transistor 1320, and a second resistor 1325. The voltage source 1305 connects to one terminal of the first resistor 1310. The other terminal of the first resistor 1310 connects to the gate of the first transistor 1315 and the emitter of the second transistor 1320. The source of the first transistor 1315 connects to the optocoupler 1205. The drain of the first transistor 1315 connects to the base of the second transistor 1320 and one terminal of the second resistor 1325. The other terminal of the second resistor 1325 connects to the collector of the second transistor 1315 and the negative terminal of the voltage source 1235.

In operation, current flows from the voltage source 1305 through the first resistor 1310 to activate the first transistor 1315 such that the first transistor 1315 conducts. When a terminal of a battery unit 195 connects to ground, current flows through the optocoupler 1205, the first transistor 1315, and the second resistor 1325. The voltage that develops across the second resistor 1325 activates the second transistor 1320. As the second transistor conducts 1320, current is diverted from the gate of the first transistor 1315. The transistors 1315, 1320 and resistors 1310, 1325 reach equilibrium such that a constant current flows through the first transistor 1315.

The transistor 1315 can be any type of transistor, such as a metal-oxide-semiconductor field-effect transistor (MOSFET), an insulated gate bipolar transistor (IGBT), or a NPN transistor. In some embodiments, a 2N3904-type transistor is used for the second transistor 1320.

FIG. 15 is a circuit diagram depicting an exemplary embodiment of the pack voltage and pack current input systems of the computing device. The battery pack 190 can connect to the systems at terminals 1401, 1402. Resistors 1405, 1406, 1407, 1408, 1409, 1410 can divide the battery pack 190 voltage from 500V to 2V, by way of example. A capacitor 1411 can filter the divided voltage, and an A/D converter 1415 can sample the voltage. The A/D converter 1415 can transmit the voltage to a processor of the computing device 110, such as CPU 905. Optocouplers 1420, 1421, 1422 can create an isolated communication interface between the A/D converter 1415 and the processor.

The voltage drop across a shunt can be input at terminal 1430. The operational amplifier 1435, resistors 1436, 1437, and capacitors 1438, 1439, 1440 can form an amplifier to amplify the voltage drop. Because the amplifier has a fixed gain, such as 80, the amplified voltage may exceed the capacity of the A/D converter 1445 that samples the voltage. Thus, resistors 1447, 1448 can form a voltage divider that divides the amplified voltage to a level the A/D converter 1445 can process. The A/D converter 1445 can sample the voltage and transmit the voltage to the processor, which can calculate the battery pack 190 current based on the value of the shunt. The A/D converter 1445 can use the same communication interface as the A/D converter 1415 to transmit its sampled voltage.

FIG. 16 is a circuit diagram depicting an exemplary embodiment 1500 of the central processing unit 905 of the computing device 110. Resistors 1501-1519, capacitors 1520-1527, Zener diodes 1530-1532, and inverters 1535-1537 condition the inputs and outputs for the central processing unit 1550.

FIG. 17 is a circuit diagram 1700 depicting an exemplary embodiment of another power supply that can be used with the battery management system 100. The power supply 1700 can be an isolated power supply. Components 1701-1708 can operate as an oscillator that produces 40 KHz. The transformer with windings 1709-1711 can transfer energy produced by the oscillator to components 1712-1721, which can operate as positive and negative half-wave rectifiers and a shunt regulator. The rectifiers and shunt regulator can operate to produce a substantially constant output voltage.

Referring now to FIG. 18, a block diagram of an embodiment of a battery unit balancing system 19 is shown and described. The battery unit balancing system 19 can include a pair of terminals 95a and 95b (collectively 88). The battery unit balancing system 19 can include an output device 105 and a discharging circuit 98. The discharging circuit can include a voltage dividing circuit 109, a comparator circuit 99 with its own output device 91 and shunt regulator 114 (e.g., a programmable Zener diode, a TLV431 manufactured by Texas Instruments, Inc. of Dallas. Tex.), and a current source 115 each connected in parallel to the terminals. The voltage dividing circuit 109 can connect to the current source 115 via the comparator circuit 99.

In operation, the terminals 88 of the battery unit balancing system 19 can be connected to a battery unit. When the battery unit is connected to the terminals with the incorrect polarity, no current flows. When the battery unit is connected correctly, current flows from one terminal 95a to the other 95b through the output device 105, powering the output device (e.g., a light emitting diode or LED) to emit light. In this manner, the output device can indicate to a user of the battery unit balancing system that the battery unit has been correctly connected to the system and the system is receiving power.

The voltage dividing circuit 109 can generate a partial voltage based on the voltage of the battery unit and provide the partial voltage to the comparator circuit 99. When the voltage of the battery unit exceeds a predetermined threshold, the comparator circuit can be automatically activated to conduct current from the battery unit. The current can power the output device 91 of the comparator circuit to emit light. Thus, the output device can indicate that the discharging circuit 98 has been activated.

Further, from the current, the comparator circuit 99 can generate a programmable voltage that activates the current source circuit 115. The current source can draw a constant discharging current from the battery unit. As the current source draws current, the voltage of the battery unit falls. When the voltage falls below the predetermined threshold, the comparator circuit 99 deactivates and the current source ceases to draw current from the battery unit, leaving the battery unit with the desired voltage.

Referring now to FIG. 19, a circuit diagram of an embodiment of a battery unit balancing system 200 is shown and described. The battery unit balancing system includes a pair of terminals 95a and 95b (collectively, 95) that can connect to a battery unit. The system includes an output device 105' (in this embodiment, a green LED) connected in series with a resistor 205 and another diode 210. When the voltage of the battery unit exceeds the on-voltages of the LED 105' and the diode 210, the LED and diode 210 conduct. Current flows through the LED, and the LED emits light to indicate to a user that the battery unit has been connected correctly to the system 200.

The voltage dividing circuit 109' generates a predetermined voltage at the node (also referred to herein as the "node voltage") between the first resistor 215 and the second resistor 220 to activate the shunt regulator 114 and consequently, the current source 115. The resistances of the first resistor 215 and the second resistor 220 determine the value of the node voltage according to the following equation:

$$V\text{node} = V\text{battery unit} * R2/(R1+R2)$$

The resistors 215 and 220 can be variable resistors with adjustable resistances. The resistors can be programmed to generate any voltage from the voltage of the battery unit. In some embodiments, the resistors 215 and 220 can have fixed resistances. In this embodiment, the first resistor 215 has a resistance of 20,000 Ohms and the second resistor 220 has a resistance of 10.000 Ohms. Thus, the node voltage is ⅓ the voltage of the battery unit connected to the terminals 102.

When the voltage of the battery unit is below a predetermined threshold (e.g., about 3.7 V), the voltage dividing circuit 109' generates a node voltage below the on-voltage (e.g., about 1.2 V) of the shunt regulator 114. Under these circumstances, the shunt regulator 114 does not conduct. However, when the voltage of the battery unit equals or exceeds the predetermined threshold, the node voltage applied to the shunt regulator 114 activates the shunt regulator 114. Upon activation, current flows from the battery unit through the third resistor 225, the red LED 112', and the shunt regulator 114. The current powers the red LE) 112', which emits light and indicates to a user that the discharge circuit 107 has been activated, the entire outer perimeter of the dashed boxes.

Further, current flowing through the comparator circuit (e.g., from the base of the first transistor 250 through the fourth, current limiting resistor 240) can activate the current source 115. The current can flow through the fourth resistor 240 (e.g., out of the base of the first transistor 250), to form a voltage on the base of the first transistor 250, thereby beginning to turn on the first transistor 250 Once the first transistor 250 conducts, current can flow from the first terminal 95a of the battery unit through the fifth resistor 265, the sixth resistor 270, and the first transistor 250 to the second terminal 95b of the battery unit.

As current flows through the fifth 265 and sixth resistors 270 (e.g., out of the base of the second transistor 255), a voltage can form on the base of the second transistor 255. The voltage on the second transistor 255 rises, and the second transistor 255 begins to turn on. When the second transistor 255 conducts, the second transistor 255 draws current from the base of the first transistor 250 and starves the base for current. In this manner, the first transistor 250 and the second transistor 255 interact to form an equilibrium so that a substantially stable current flows from one terminal 95a to the other 95b through the fifth 265 and sixth resistors 270, thereby dissipating power. The current can continue to flow independent of the voltage of the battery unit. In some embodiments, the discharging current is about 0.5% of the ampere-hour rate of the battery unit. In many embodiments, the discharging current is selected from 0.22 A, 0.33 A, 0.5 A, 0.89 A or 1.11 A.

As the current source 115' draws current from the battery unit, the voltage of the battery unit falls. The node voltage of the voltage dividing circuit 109' falls in tandem. When the node voltage falls below the predetermined threshold of the shunt regulator 1114, the shunt regulator ceases to conduct. Current stops flowing through the red LED 96 and the red LED turns off, thereby indicating to the user that the discharging circuit 107' is no longer activated. Consequently, current stops flowing to the base of the first transistor 250. In turn, the first transistor 250 stops conducting and thus shuts off the current source 115. In this manner, the discharging circuit 98 automatically deactivates once the battery unit reaches the predetermined threshold voltage.

Referring now to FIG. 20, a circuit diagram of another embodiment of a battery unit balancing system 300 is shown and described. The battery unit balancing system 300 duplicates the terminals 95a and 95b, output device, voltage dividing circuit, the comparator circuit, and current source of the battery unit balancing system 200 of FIG. 19. In addition, the battery unit balancing system 300 includes a second current source. The second current source duplicates the components of the first current source and operates according to the same principles. Since each current source draws the same amount of current, adding current sources to the discharging circuit creates a balancing system 300 that drains the battery unit at a faster rate. In this manner, the battery unit balancing system 300 can balance a battery unit is a shorter amount of time. Although the system 300 includes two current sources, additional current sources can be added as desired by one of ordinary skill in the art.

Referring now to FIG. 21, a block diagram of an embodiment of a plurality of battery unit balancing systems for balancing a battery pack is shown and described. A battery pack balancing system 400 includes a plurality of battery unit balancing systems, each system being autonomous from one another. Each battery unit balancing system can connect to a battery unit 402 in a battery pack 405. Each balancing system can balance its corresponding battery unit 402. The balancing systems can balance the battery units 402 to a substantially equal, or the same voltage level. Thus, the battery pack balancing system 400 can obtain a battery pack whose battery units 402 exhibit substantially the same state of charge level.

FIG. 22 shows an exemplary integrated battery control system 800 in a single control enclosure 820. A battery power input connecter 840 and a power output connecter 850 extends from the outer housing 822. The integrated battery control system provides a simplified connection and control system that can be quickly and easily installed into a vehicle. A battery pack can be coupled to the battery power input 840, a power connector can be coupled between the power output connector 850 and a motor controller. In some cases a connector from the battery unit monitoring module(s) can be coupled to the data input port 880. The integrated battery control system 800 has a number of other inputs/outputs including, a key-switch input 842 and output 852, a pre-charge output, an over voltage ouput 810, a modbus interface 814, a meter interface 816, battery charger inputs or terminals. 866, 866' and a charger connector sensor input 860.

As shown in FIG. 23, an exemplary control enclosure 820 has a plurality of inputs and outputs that are part of the integrated battery control system 800. An interlock sensor input 869 is configured to determine if a battery charger is coupled with the electric vehicle. An interlock sensor may be a physical switch, or charger connector sensor 356 that is activated when a charger plug 352 is coupled with the electric vehicle 360, as shown in FIG. 29. An interlock sensor may be a charger power sensor 870, such as a charger power sensor circuit 872 that can determine if a charger plug is connected by measuring an electrical factor associated with the charger port or battery charger inputs 866. As shown in FIG. 23 a charger connector sensor input 860 is configured as a separate input to the battery charger input 866. In an exemplary embodiment, a charger connector sensor comprises a circuit that is physically opened when a charger plug is coupled with a charging port and this open circuit disables power delivery to the motor of the electric vehicle. The charger connector sensor circuit may be coupled with the control circuit 901 and the control circuit may control power distribution from the batteries and to the power output connector. In another embodiment, a charger connector sensor input 860 provides a signal to the control system computing device 900 of the status of a battery charger plug being coupled with a charging port. In this embodiment, the control system computing device may control a switch to disable power to a drive motor. Likewise, a charger power sensor 870 may be coupled with the charger input 866 to determine if a charger plug is coupled with a charging port. A charger power sensor, such as a circuit, may measure electrical resistance, voltage or current across the charger inputs, or charger plug terminal, to determine if the battery charger plug is coupled with the charging port. A charger power sensor may provide a signal to the control system computing device 900 or result in an open circuit that disables power deliver to the drive motor, when a charger plug is coupled with a charging port. A charger power sensor 870, such a charger power sensor circuit, may be configured within the control enclosure 820 or proximal to a charger port.

A key-switch input 842 provides input of the status of a key-switch to the control system computing device 900 or control circuit 901. As described herein, when the computing device receives a key-switch signal that the electric vehicle is to turn on, the control system computing device 900 may initiate charging of a pre-charge resistor through the pre-charge output 812 and subsequently enable power to the electric motor or other propelling device through the output power connector 850. The key-switch output 852 provides power to the electronics of an electric vehicle, such as the lights, radio, sensors, etc, but not necessarily the electric motor or other propulsion system of the electric vehicle. A modbus input 814 enables connection with an external computing device, such as a computer or laptop, to provide system data to the computer including battery pack or individual battery voltage, state of charge, or temperature, for example, A sense board input 823 may be used to receive information from one or more battery unit monitoring modules. Any suitable data transmission cable from a battery pack or a first battery unit monitor module(s) may be coupled with the sense board input. As described herein a battery management system's computing device 52 may send a data request through the a data transmission cable coupled with the sense board input 823. As described herein, information from a battery unit monitoring module may be received wirelessly and a wireless signal transmitter and receiver may be configured within the integrated battery control system. The meter output 816 is configured to connect with a meter to display a power attribute of the battery pack, such as pack voltage, state-of-charge, temperature or estimated life. The meter 973 is showing a display 971 of 85% full, or 85% of a full charge of the battery pack. A meter signal 977 is provided through the coupling of the meter with the meter interface 816. A power attribute of a battery pack may be converted into fuel level output including full, and empty, for example. Also shown in FIG. 23, is an over voltage output 810 that turns off a connected battery charger once the battery pack is fully charged as indicated through the battery voltage.

The battery power input 840 is configured to couple with a battery pack and the electrical power received from the batteries is regulated by the power control system 801. In one embodiment, a power control system comprises a control system computing device 900 that manages delivery of power to the electric vehicle to ensure proper and safe operation and may operate one or more switches, such as the power output switch 805. As shown, the control system computing device 900 is coupled with, and controls a power output switch 805 that is configured between the batter power input 840 and the power output connector 850. Any number of switches may be controlled by the control system computing device to properly manage operation of the vehicle.

An integrated battery control system 800 also comprises a battery management system 16, or part thereof. A battery management system comprises a computing device 52 to monitor the voltage level of the batteries within the battery pack. A single computing device or two separate computing devices may be used for the power control system and the battery management system. The battery management system 16 comprises a computing device 52 and in one embodiment, a single computing device is utilized for both the battery management system and the power control system. As shown in FIG. 23, an integrated battery management system greatly simplifies installation and operation of a battery pack and charger system for the purposes of operating an electric vehicle.

As shown in FIG. 24, an exemplary power control system 801 comprises components including a shunt 890 and control electronics 896. A shunt 1200 may be configured to measure the state of charge of a battery pack as the electrical power is drawn from the battery pack and supplied to a battery powered device, such as a vehicle. A portion of the control circuit 901 is shown.

FIG. 25 shows a black and white photograph of exemplary integrated battery control system 800 including a control enclosure and a control board 891 having a microprocessor 892. A microprocessor is one example of a computing device 900. A portion of the control enclosure is detached from the electronic portion of the integrated battery control system.

FIG. 26 shows an exemplary schematic of an integrated battery control system for a golf cart. The major electronic components are a battery charger 1420, the, the battery pack 12, the motor speed controller 1560 and a voltage converter 933. The integrated battery control system controls other components of the system. The integrated battery control system keeps track of the current flow in and out of the battery unit 12 for purposes of calculating the state of charge. The integrated battery control system will turn off the charger 1420 when the battery reaches a set over voltage threshold. Similarly, the integrated battery control system will turn off the motor via the motor speed controller 1560 when the battery state of charge goes below a pre-determined level. The key-switch 853 is open in this embodiment. The control circuit 901 includes a key-switch 853 that is open or closed depending when the electric vehicle is turned on, such as by turning of an actual key in a key receiver.

FIG. 27 a schematic of the internal logic of the integrated battery control system. The key-switch 853 signals the unit to turn on. This creates a 10 second pulse which supplies power to the pre-charge resistor 1600 and turns on the internal power supply until the control system computing device 900 boots up. As long as there is not an under voltage condition, the key-switch output will activate. If the golf cart is not coupled with a charger that would open an interlock sensor switch and the under voltage signal (UV) threshold is exceeded, the battery+output will become active and supply power to the loads connected to the integrated battery control system, such as a motor in an electric vehicle. Since the integrated battery control system contains a control system computing device 900, it senses the current supplied by a charger or a load to compute the state of charge. It also gathers data from the sense boards about voltage and in some cases temperature of the individual battery units. Should there be an out of range condition for either the voltage or temperature, power will be removed from the load or the charger will be disabled.

FIG. 28 is a schematic of the charger power sensor circuit 872. When mains voltage (120 or 240V AC) is applied to the input terminals 866' and 866 a current will flow through the resistor to either the LED in optocoupler 2100 during the positive half cycle or the diode during the negative half cycle. In the presence of light from the LED) in the optocoupler, which results from the AC being present, the output transistor in the optocoupler 2100 will turn on, discharging capacitor 939. The repeating cycles of the output transistor turning on will keep the capacitor discharged. When the mains are removed, the capacitor will no longer be discharged and the voltage across it will increase. A Schmitt trigger inverter 939 will sense this voltage and at about 6V will turn on since it is powered by a 12V power supply. The resulting low going signal can be used to activate the power supplies of the integrated battery control system. This signal is called ~AC Good. Since the microprocessor needs to also sense the presence of this signal, it is divided down to a level appropriate for the microprocessor, i.e. 3.3V, and cleaned up by a Schmitt trigger powered from the microprocessor power supply. As described herein, an AC power sensor may comprise a circuit that can sense when an AC power supply connection is made, with the integrated battery control system.

FIG. 29 shows an electric vehicle 860 having an integrated battery control system 800 contained within a control enclosure 820 and configured within the electric vehicle 360. An electric vehicle, as used herein, includes any vehicle or apparatus configured to move and be powered to move by an onboard battery pack. An electric vehicle, as used herein, includes vehicles, such as the golf cart 361 shown in FIG. 29, electric cars, or hybrid electric vehicles, powered carts, scooters, motorcycles, three-wheeled passenger vehicles, and the like. An electric vehicle may be configured to move people, packages, or carry other electronic devices, such as cameras, in the case of drones, for example. The integrated battery control system is configured within the golf cart and is coupled with a charging port 350, a battery pack 12 and a key-switch 850. A key-switch input 842 provides a signal to the control system computing device that a key-switch has been activated. Likewise, a charger connector sensor input 860 is coupled with the charger connector sensor 356 that is configured with the charging port 350. When the charger plug 352 is inserted into the charger port 350, the charger connector sensor 356 is activated and in one embodiment opens a switch. Power may be interrupted to the electric motor 819 when the charger connector sensor switch is open. The integrated battery control system is coupled with the power supply, or battery pack 12, and the electric motor 819 configured to propel the golf cart. Any suitable electrical powered propulsion device may be used to propel the electric vehicle in at least one direction of motion and the term electric motor is used herein for convenience. The power plug 352 is couple with a charger cord that is terminated with a plug 1490 that is coupled with a wall outlet 1400.

It will be apparent to those skilled in the art that various modifications, combinations and variations can be made in the present invention without departing from the spirit or scope of the invention. Specific embodiments, features and elements described herein may be modified, and/or combined in any suitable manner. Thus, it is intended that the present invention cover the modifications, combinations and variations of this invention provided they come within the scope of the appended claims and their equivalents.

What is claimed is:

1. An integrated battery control system comprising:
   a. a battery management system comprising:
      i. a computing device configured in a control enclosure and comprising:
         an output data request port; and
         an input data port;
         wherein the computing device receives battery data from a battery unit monitoring module including the state of charge of two or more batteries in a battery pack; and
   b. the control enclosure comprising:
      i. a power control system comprising:
         a control circuit;
         a battery power input configured to provide a battery power supply to the integrated battery management system;
         a battery charger input;
         an output power connector,
         a power output switch;
         a key-switch input;
         a shunt;
   c. an interlock sensor configured to detect when a battery charger is connected to the integrated battery control system;
   whereby when said interlock sensor detects a battery charger connection, the power output switch opens, thereby preventing power supply to a drive motor of an electric vehicle through the output power connector;
      whereby when a key-switch is detected through the key-switch input and when data received from the battery management system indicates that a battery unit is below a threshold value, the integrated battery control system disables the battery power supply to a drive motor and to a pre-charge resistor;
      whereby when a key-switch is detected through the key-switch interface and when data received from the battery management system indicates that all of said battery units are above a threshold value, the integrated battery control system enables the battery power supply to a pre-charge resistor for a pre-charge time and then enables power supply to a drive motor; and
      whereby the battery power input is connected with a shunt to measure a power level provided from the battery pack coupled with the battery power input.

2. The integrated battery control system of claim 1, wherein the power control system comprises a control system computing device.

3. The integrated battery control system of claim 1, wherein the control system computing device controls the opening and closing of the power output switch to regulate power as a function of the battery pack's voltage level or the battery charger connection status with the integrated battery control system.

4. The integrated battery control system of claim 1, wherein the interlock sensor is an charger power sensor.

5. The integrated battery control system of claim 4, wherein the charger power sensor is a charger power sensor circuit.

6. The integrated battery control system of claim 1, wherein the interlock sensor is a charger connector sensor.

7. The integrated battery control system of claim 6, wherein the charger connector sensor comprises a switch that is physically activated when a charger plug is inserted into a charging port.

8. The integrated battery control system of claim 1, comprising a meter interface that provides a state-of-charge signal to a meter display.

9. The integrated battery control system of claim 1, wherein the pre-charge time is 5 seconds or more.

10. The integrated battery control system of claim 1, where in the battery management system further comprises:
   i. a first battery unit monitoring module coupled with a first battery unit and comprising:
      an input data request port connected to the output data request port of the computing device; and
      an output data request port;
      an output data port connected to the input data port of the computing device;
   ii. a second battery unit monitoring module coupled with a second battery unit and comprising:
      a single input data request port connected only to the output data request port of the first battery unit monitoring module, therein defining a module connection between said first battery unit monitoring module and said second battery unit monitoring module; and
      an output data port connected to the input data port of the computing device
   wherein the first battery unit monitoring is a master to said second battery unit monitoring module and the second battery unit monitoring module is a slave to the first battery unit monitoring module;
   wherein the first battery unit monitoring module responds to a data request signal from the output data request port of the computing device by transmitting data of the first battery unit to the input data port of the computing device and subsequently transmits a data request to the second battery unit monitoring module through said module connection; and
   wherein the second battery unit monitoring module responds to the data request from the output data request port the first battery unit monitoring module by transmitting data of the second battery unit to the input data port of the computing device;
   wherein the computing device receives data from the first and second battery unit monitoring modules sequentially after sending a single data request signal to only the first battery unit monitoring module; and
   wherein the computing device receives data from the second battery unit monitoring module automatically after receiving data from the first battery unit monitoring module.

11. The integrated battery control system of claim 10, comprising a low voltage disconnect algorithm, wherein a power supply from the battery pack is disconnected when the data of at least one of the first or second battery units is received by the computing device and includes a voltage that is below a low voltage threshold value.

12. The integrated battery control system of claim 10, wherein the battery monitoring module comprises an analog-to-digital converter that measures a voltage of the first battery unit.

13. The battery management system of claim 10, wherein the first battery unit monitoring module comprises a temperature monitoring device that measures a temperature of the first battery unit.

14. The battery management system of claim 10, wherein the data of the first battery unit is a voltage and a temperature of the first battery unit.

15. The battery management system of claim 14, wherein the data of the second battery unit is a voltage and a temperature of the second battery unit.

16. The integrated battery control system of claim 10, wherein the computing device transmits a second data request to the battery monitoring module coupled to the first lithium battery, after said computing device has not received a data input through the battery data input for a predetermined period of time.

17. The battery management system of claim 10, wherein the computing device further comprises an analog-to-digital converter that measures a voltage across the first and second battery units.

18. The battery management system of claim 10, wherein the computing device further comprises an analog-to-digital converter that measures a current flowing in the first and second battery units.

19. The integrated battery control system of claim 10, wherein the computing device is configured to shut off a battery charge when the computing device detects a high voltage condition across the first and second battery units.

20. The integrated battery control system of claim 1, wherein the battery management system further comprises:
   a wireless computer signal transmitter coupled with the output data request port; and
   a wireless computer signal receiver coupled with the input data port;
   a first battery unit monitoring module coupled with a first battery unit and comprising:
      an input data request port coupled with a first module wireless signal receiver that is connected wirelessly to the wireless computer signal transmitter of the output data request port of the computing device;
      an output data port coupled with a first wireless module signal transmitter connected wirelessly to the wireless computer signal receiver of the input data port of the computing device;
   wherein computing device sends a data request to the output data request port that is converted into a wireless signal by the wireless computer signal transmitter;
   wherein said data request is received by the first wireless module signal receiver and provided to the input data request port;
   wherein the first battery unit monitoring module responds to a data request signal from the output data request port of the computing device by transmitting data of the first battery unit wirelessly through the first wireless module signal transmitter to the input data port of the computing device;
   a second battery unit monitoring module coupled with a second battery unit and comprising:
      a second input data request port coupled with a second module wireless signal receiver that is connected wirelessly to the wireless computer signal transmitter of the output data request port of the computing device;
      a second output data port coupled with a second wireless module signal transmitter connected wirelessly to the wireless computer signal receiver of the input data port of the computing device;
   wherein computing device sends a data request to the output data request port that is converted into a wireless signal by the wireless computer signal transmitter;
   wherein said data request is received by the second wireless module signal receiver and provided to the second input data request port;
   wherein the second battery unit monitoring module responds to a data request signal from the output data request port of the computing device by transmitting data of the second battery unit wirelessly through the second wireless module signal transmitter to the input data port of the computing device.

* * * * *